(12) United States Patent
Lee et al.

(10) Patent No.: US 11,752,753 B2
(45) Date of Patent: Sep. 12, 2023

(54) SUPPORT, BONDING APPARATUS INCLUDING THE SUPPORT, AND METHOD OF FABRICATING DISPLAY DEVICE USING THE BONDING APPARATUS

(71) Applicant: Samsung Display Co., LTD., Yongin-si (KR)

(72) Inventors: Jungkyu Lee, Incheon (KR); Youngsu Kim, Gunpo-si (KR); Kyungrok Ko, Suwon-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 218 days.

(21) Appl. No.: 17/189,855

(22) Filed: Mar. 2, 2021

(65) Prior Publication Data

US 2021/0384480 A1    Dec. 9, 2021

(30) Foreign Application Priority Data

Jun. 3, 2020  (KR) .......................... 10-2020-0067129

(51) Int. Cl.

| | |
|---|---|
| *H01L 51/56* | (2006.01) |
| *B32B 38/18* | (2006.01) |
| *G06F 1/16* | (2006.01) |
| *G06F 1/18* | (2006.01) |
| *B32B 37/00* | (2006.01) |

(Continued)

(52) U.S. Cl.
CPC ...... *B32B 38/1866* (2013.01); *B32B 37/0046* (2013.01); *B32B 37/10* (2013.01); *B32B 38/1841* (2013.01); *G06F 1/1652* (2013.01); *G06F 1/181* (2013.01); *H10K 71/00* (2023.02); *H10K 77/111* (2023.02); *B32B 2457/20* (2013.01)

(58) Field of Classification Search
CPC ............ B32B 38/1866; B32B 38/1858; B32B 38/1841; B32B 37/0046
See application file for complete search history.

(56) References Cited

U.S. PATENT DOCUMENTS

| | | | |
|---|---|---|---|
| 9,426,893 B2 * | 8/2016 | Huang ................. | H05K 3/0067 |
| 10,194,538 B2 * | 1/2019 | Lee ..................... | B32B 38/1866 |

(Continued)

FOREIGN PATENT DOCUMENTS

| | | |
|---|---|---|
| KR | 10-1578442 | 12/2015 |
| KR | 10-1706617 | 2/2017 |

(Continued)

*Primary Examiner* — Philip C Tucker
*Assistant Examiner* — John Blades
(74) *Attorney, Agent, or Firm* — KILE PARK REED & HOUTTEMAN PLLC

(57) ABSTRACT

A bonding apparatus includes a support including a cavity, and a window fixing chuck facing the support. The support includes a first part including a first through hole extending from the cavity, and a second part extending in a downward direction from the first part and including a second through hole extending from the cavity. A first distance between a first inner surface of the first part and a first outer surface of the first part is less than a second distance between a second inner surface of the second part and a second outer surface of the second part. The first inner surface of the first part and the second inner surface of the second part form the cavity.

18 Claims, 39 Drawing Sheets

(51) Int. Cl.
  *B32B 37/10* (2006.01)
  *H10K 71/00* (2023.01)
  *H10K 77/10* (2023.01)

(56) References Cited

U.S. PATENT DOCUMENTS

2009/0277578 A1* 11/2009 Sung ..................... B32B 37/10
                                                    156/60
2018/0093464 A1*  4/2018 Lee ...................... B32B 37/003

FOREIGN PATENT DOCUMENTS

KR      10-1765299      8/2017
KR      10-1893101      8/2018

* cited by examiner

SUPPORT, BONDING APPARATUS INCLUDING THE SUPPORT, AND METHOD OF FABRICATING DISPLAY DEVICE USING THE BONDING APPARATUS

CROSS-REFERENCE TO RELATED APPLICATION(S)

This application claims priority to and benefits of Korean Patent Application No. 10-2020-0067129 under 35 U.S.C § 119 filed on Jun. 3, 2020 in the Korean Intellectual Property Office, the entire contents of which are incorporated herein by reference.

BACKGROUND

1. Technical Field

The disclosure relates to a support, a bonding apparatus including the support, and a method of fabricating a display device using the bonding apparatus.

2. Description of the Related Art

Electronic products, such as smart phones, digital cameras, laptop computers, navigation systems, and smart televisions, may include a display device for displaying an image. A display device may generate an image and may provide users with an image displayed on a display screen.

With the advancement of display technology, various types of display devices have recently been developed. For example, a display device is developed to display an image on a front surface thereof and also on rear and side surfaces thereof.

A display device may include a display panel that displays an image, and also may include a window that may be disposed on and protects the display panel. The display panel and the window may be processed to rest along front, rear, and side surfaces of the display device to display an image on the front, rear, and side surfaces thereof.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

An embodiment provides a support capable of preventing bonding failure between a display panel and a window, a bonding apparatus including the support, and a method of fabricating a display device using the bonding apparatus.

According to an embodiment, a bonding apparatus may include a support including a cavity; and a window fixing chuck facing the support. The support may include a first part including a first through hole extending from the cavity; and a second part including a second through hole extending from the cavity. The second part may extend in a downward direction from the first part. A first distance between a first inner surface of the first part and a first outer surface of the first part may be less than a second distance between a second inner surface of the second part and a second outer surface of the second part. The first inner surface of the first part and the second inner surface of the second part may form the cavity.

In an embodiment, a length of the first through hole of the first part may be less than a length of the second through hole of the second part.

In an embodiment, a size of the first through hole in an extending direction of the first through hole may be greater than a size of the second through hole in an extending direction of the second through hole.

In an embodiment, the second distance of the second part may increase as approaching a lower portion of the second part from an upper portion of the second part. The upper portion of the second part may be adjacent to the first part.

In an embodiment, the first part may include a plurality of first through holes. The second part may include a plurality of second through holes. Lengths of the plurality of second through holes may increase as approaching the lower portion of the second part from the upper portion of the second part.

In an embodiment, a number of the plurality of first through holes of the first part may be less than a number of the plurality of second through holes of the second part.

In an embodiment, an interval between the plurality of first through holes of the first part may be different from an interval between the plurality of second through holes of the second part.

In an embodiment, the support may extend in a third direction intersecting a plane defined by a first direction and a second direction, the second direction intersecting the first direction. The first outer surface of the first part may include a curved surface that may be convex in an upper direction viewed in the first direction. The second outer surface of the second part may include a plane defined by the first and third directions.

In an embodiment, the first distance of the first part may be measured in a direction normal to the first outer surface of the first part. The second distance of the second part may be measured in the second direction.

In an embodiment, the window fixing chuck may include a groove. The groove may face the support and extend in the first direction. The window fixing chuck may include a concavely curved surface at an inside distal end facing the curved surface of the first outer surface of the first part.

In an embodiment, the second inner surface of the second part may include a surface inclined at a predetermined angle relative to the third direction.

In an embodiment, the second distance of the second part may be consistent (or constant) from an upper portion of the second part to a lower portion of the second part. The upper portion of the second part may be adjacent to the first part.

In an embodiment, the first part may include a plurality of first through holes. Sizes of the plurality of first through holes in extending directions of the plurality of first through holes may decrease approaching the second part from a central portion of the first part.

In an embodiment, the second part may include a plurality of second through holes. Sizes of the plurality of second through holes in extending directions of the plurality of second through holes may decrease approaching a lower portion of the second part from an upper portion of the second part. The upper portion of the second part may be adjacent to the first part.

In an embodiment, the first through hole may extend in a direction.

In an embodiment, a size of the first through hole in an extending direction of the first through hole may be the same as a size of the second through hole in an extending direction of the second through hole.

In an embodiment, the second part may include a plurality of second through holes. Intervals between the plurality of second through holes may increase as approaching a lower portion of the second part from an upper portion of the second part. The upper portion of the second part may be adjacent to the first part.

In an embodiment, the bonding apparatus may include a plurality of cavities, a plurality of first through holes, and a plurality of second through holes. The plurality of first through holes and the plurality of second through holes may extend from the plurality of cavities.

According to an embodiment, a method of fabricating a display device may include placing a display panel on an outer surface of a support that may include a first part and a second part extending in a downward direction from the first part, the first part including a first through hole and the second pat including a second through hole; placing a window in a groove of a window fixing chuck on the support; placing the support in the groove; and attaching the display panel to the window by introducing air into the first through hole of the first part and the second through hole of the second part, the air moving the display panel toward the window. The air may pass more rapidly through the first through hole of the first part than through the second through hole of the second part.

In an embodiment, the method may further include introducing the air into a cavity included in the support. The first through hole of the first part and the second through hole of the second part may extend from the cavity. A first distance between a first inner surface of the first part and a first outer surface of the first part may be less than a second distance between a second inner surface of the second part and a second outer surface of the second part. The first inner surface of the first part and the second inner surface of the second part may form the cavity.

In an embodiment, the attaching of the display panel to the window may include attaching a first bent part of the display panel to a second bent part of the window by introducing the air into the first through hole of the first part, the first bent part being disposed on the first through hole, and the second bent part being adjacent to the first bent part; and attaching a plurality of first flat parts of the display panel to a plurality of second flat parts of the window by introducing the air into the second through hole of the second part, the first flat parts being disposed on the second through hole, and the second flat parts being adjacent to the first flat parts.

In an embodiment, a length of the first through hole of the first part may be less than a length of the second through hole of the second part. A size of the first through hole in an extending direction of the first through hole of the first part may be greater than a size of the second through hole. The size of the first through hole may be viewed in an extending direction of the first through hole in an extending direction of the second through hole.

According to an embodiment, a support may include a first part including a first through hole; and a second part extending in a downward direction from the first part, and including a second through hole. The first part and the second part may form a cavity in the support. The first through hole of the first part and the second through hole of the second part may extend from the cavity part of the support. A first distance between a first inner surface of the first part and a first outer surface of the first part may be less than a second distance between a second inner surface of the second part and a second outer surface of the second part. The first inner surface of the first part and the second inner surface of the second part may form the cavity. The first part may discharge air which is introduced into the cavity after the air passes more rapidly through the first through hole of the first part than through the second through hole of the second part.

In an embodiment, a length of the first through hole of the first part may be less than a length of the second through hole of the second part. A size of the first through hole in an extending direction of the first through hole may be greater than a size of the second through hole in an extending direction of the second through hole.

BRIEF DESCRIPTION OF THE DRAWINGS

Illustrative, non-limiting embodiments will be more clearly understood from the following detailed description taken in conjunction with the accompanying drawings in which.

DETAILED DESCRIPTION OF EMBODIMENTS

Figure 1:
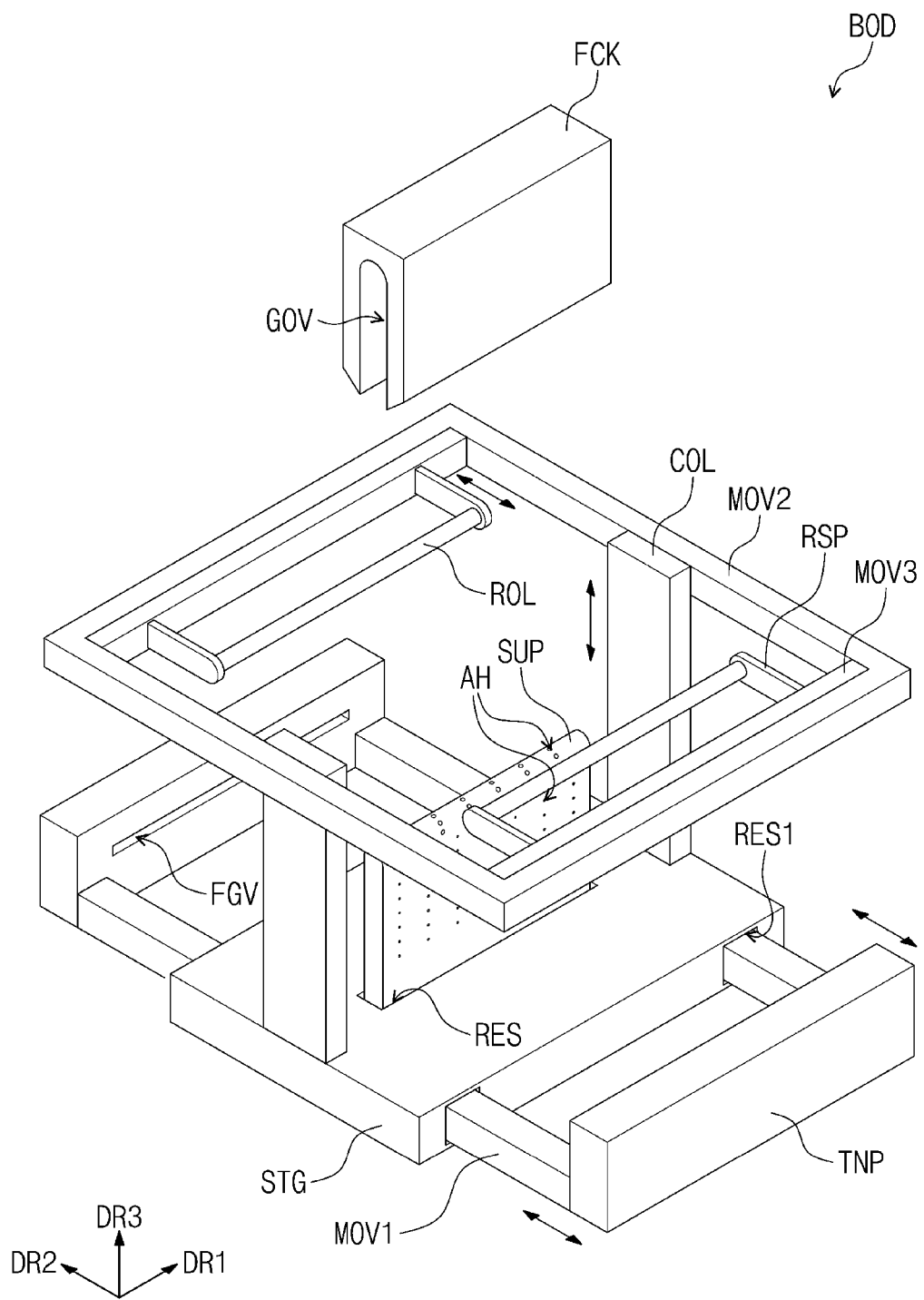
FIG. 1 illustrates a perspective view showing a bonding apparatus according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to mean "A, B, or A and B.

An expression used in the singular encompasses the expression of the plural, unless it has a clearly different meaning in the context.

In this description, when a certain component (or region, layer, portion, etc.) is referred to as being "on", "connected to", or "coupled to" other component(s), the certain component may be directly disposed on, directly connected to, or directly coupled to the other component(s) or at least one intervening component may be present therebetween.

Like numerals indicate like components. Moreover, in the drawings, thicknesses, ratios, and dimensions of components are exaggerated for effectively explaining the technical contents.

The term "and/or" includes one or more combinations defined by associated components.

It will be understood that, although the terms first, second, etc. may be used herein to describe various components, these components should not be limited by these terms. These terms are only used to distinguish one component from another component. For example, a first component could be termed a second component, and vice versa without departing from the spirit and scope of the disclosure. Unless the context clearly indicates otherwise, the singular forms are intended to include the plural forms as well.

In addition, the terms "beneath", "lower", "above", "upper", and the like are used herein to describe one component's relationship to other component(s) illustrated in the drawings. The relative terms are intended to encompass different orientations in addition to the orientation depicted in the drawings.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

Additionally, the terms "overlap" or "overlapped" mean that a first object may be above or below or to a side of a second object, and vice versa. Additionally, the term "overlap" may include layer, stack, face or facing, extending over, covering or partly covering or any other suitable term as would be appreciated and understood by those of ordinary skill in the art. The terms "face" and "facing" mean that a first element may directly or indirectly oppose a second element. In a case in which a third element intervenes between the first and second element, the first and second element may be understood as being indirectly opposed to one another, although still facing each other. When an element is described as 'not overlapping' or 'to not overlap' another element, this may include that the elements are spaced apart from each other, offset from each other, or set aside from each other or any other suitable term as would be appreciated and understood by those of ordinary skill in the art.

The phrase "in a plan view" means viewing the object from the top, and the phrase "in a schematic cross-sectional view" means viewing a cross-section of which the object is vertically cut from the side.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms used herein including technical and scientific terms have the same meaning generally understood by one of ordinary skilled in the art. Also, terms as defined in dictionaries generally used should be understood as having meaning identical or meaning contextually defined in the art and should not be understood as ideally or excessively formal meaning unless otherwise defined herein.

It should be understood that the terms "comprise", "include", "have", and the like and variations thereof are used to specify the presence of stated features, integers, steps, operations, components, elements, or combinations thereof, but do not preclude the presence or addition of one or more other features, integers, steps, operations, components, elements, or combinations thereof.

The following will now be described in detail with respect to an embodiment in conjunction with the accompanying drawings.

FIG. 1 illustrates a perspective view showing a bonding apparatus according to an embodiment.

Referring to FIG. 1, a bonding apparatus BOD according to an embodiment may include a stage STG, a support SUP, columns COL, tension parts TNP, first moving parts MOV1, a second moving part MOV2, third moving parts MOV3, rollers ROL, roller supports RSP, and a window fixing chuck FCK.

The stage STG may have a plane defined by a first direction DR1 and a second direction DR2 that may intersect the first direction DR1. The columns COL may extend in a third direction DR3 while being disposed on opposite sides of the stage STG that may face each other in the first direction DR1. The columns COL may face each other in the first direction DR1.

The third direction DR3 may be defined to indicate a direction that substantially vertically intersects a plane defined by the first and second directions DR1 and DR2. In this description, the languages "on", "above", "below", "an upward direction", or "a downward direction" may mean a relative position or a direction when viewed in the third direction DR3.

The support SUP may be disposed on the stage STG. The support SUP may be placed between the columns COL. A lower portion of the support SUP may be disposed in a recession RES defined in the stage STG.

The support SUP may extend in the first direction DR1 and the third direction DR3. Through holes AH may be defined in the support SUP. A structure of the through holes AH will be further discussed below. The support SUP may be formed rigid and may include a stainless steel.

The tension parts TNP may be disposed to face opposite sides of the stage STG that face each other in the second direction DR2. The tension parts TNP may extend in the first direction DR1.

The first moving parts MOV1 may be disposed between the tension parts TNP and the opposite sides in the second direction DR2 of the stage STG. The first moving parts MOV1 may move in the second direction DR2 while being inserted into recessions RES1 defined on the opposite sides in the second direction DR2 of the stage STG. The first moving parts MOV1 may be associated with the tension parts TNP to thereby drive the tension parts TNP to move in the second direction DR2.

Although not shown, the stage STG may have therein drive units for driving the first moving parts MOV1, but no limitation is imposed on the position of the drive units.

The second moving part MOV2 may have a substantially frame shape. For example, the second moving part MOV2 may have a substantially tetragonal frame shape, but no limitation is imposed on the shape of the second moving part MOV2. The second moving part MOV2 may be associated with the columns COL. The columns COL may be connected with the second moving part MOV2 at their outer side surfaces that may face inner side surfaces of the columns COL. The second moving part MOV2 may move in the third direction DR3.

Although not shown, the columns COL may have therein drive units for driving the second moving part MOV2, but no limitation is imposed on the position of the drive units.

The third moving parts MOV3 may be disposed to extend in the first direction DR1 and to face each other in the second direction DR2. The second moving part MOV2 may be connected with the third moving parts MOV3 at its inner side surfaces that may face each other in the first direction DR1. The third moving parts MOV3 may be correspondingly adjacent to the inner side surfaces of the second moving part MOV2 that may face each other in the first direction DR1. The third moving part MOV3 may move in the second direction DR2.

Although not shown, the second moving part MOV2 may have therein drive units for driving the third moving parts MOV3, but no limitation is imposed on the position of the drive units.

The roller supports RSP may extend in the second direction DR2. The roller supports RSP may be associated with the third moving parts MOV3. The roller supports RSP connected to corresponding third moving parts MOV3 may be arranged or disposed in the first direction DR1. Fixing grooves FGV may be defined on inner surfaces of the tension parts TNP that may face each other in the second direction DR2.

The rollers ROL may be disposed between and associated with the roller supports RSP connected to corresponding third moving parts MOV3. The rollers ROL may each have a substantially cylindrical shape that may extend in the first direction DR1. The rollers ROL may face each other in the second direction DR2. The third moving parts MOV3 may drive the rollers ROL to move in the second direction DR2, and the second moving part MOV2 may drive the rollers ROL to move in the third direction DR3.

The rollers ROL may be rotationally connected to the roller supports RSP. For example, the rollers ROL may rotate about their rotational axes parallel to the first direction DR1. The rollers ROL may move in the second direction DR2 along the roller supports RSP.

The window fixing chuck FCK may be disposed above the support SUP. The window fixing chuck FCK may have therein a groove GOV that may extend in the first direction DR1. The groove GOV may have a substantially concave shape at its inside distal end.

Figure 2:
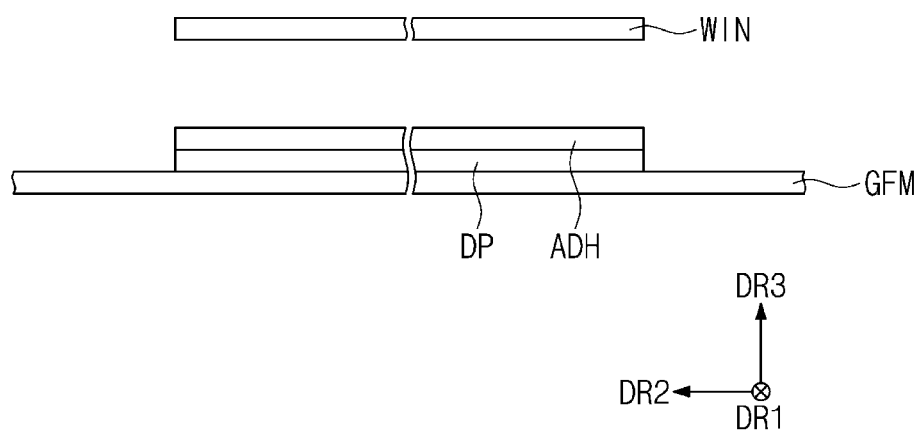
FIG. 2 illustrates a side view showing a display panel and a window that are bonded by using the bonding apparatus depicted in FIG. 1.

FIG. 2 illustrates a side view showing a display panel and a window that may be bonded by using the bonding apparatus depicted in FIG. 1.

In FIG. 2, a display panel DP and a window WIN are by way of example illustrated to show their side surfaces viewed in the first direction DR1.

Figure 19:
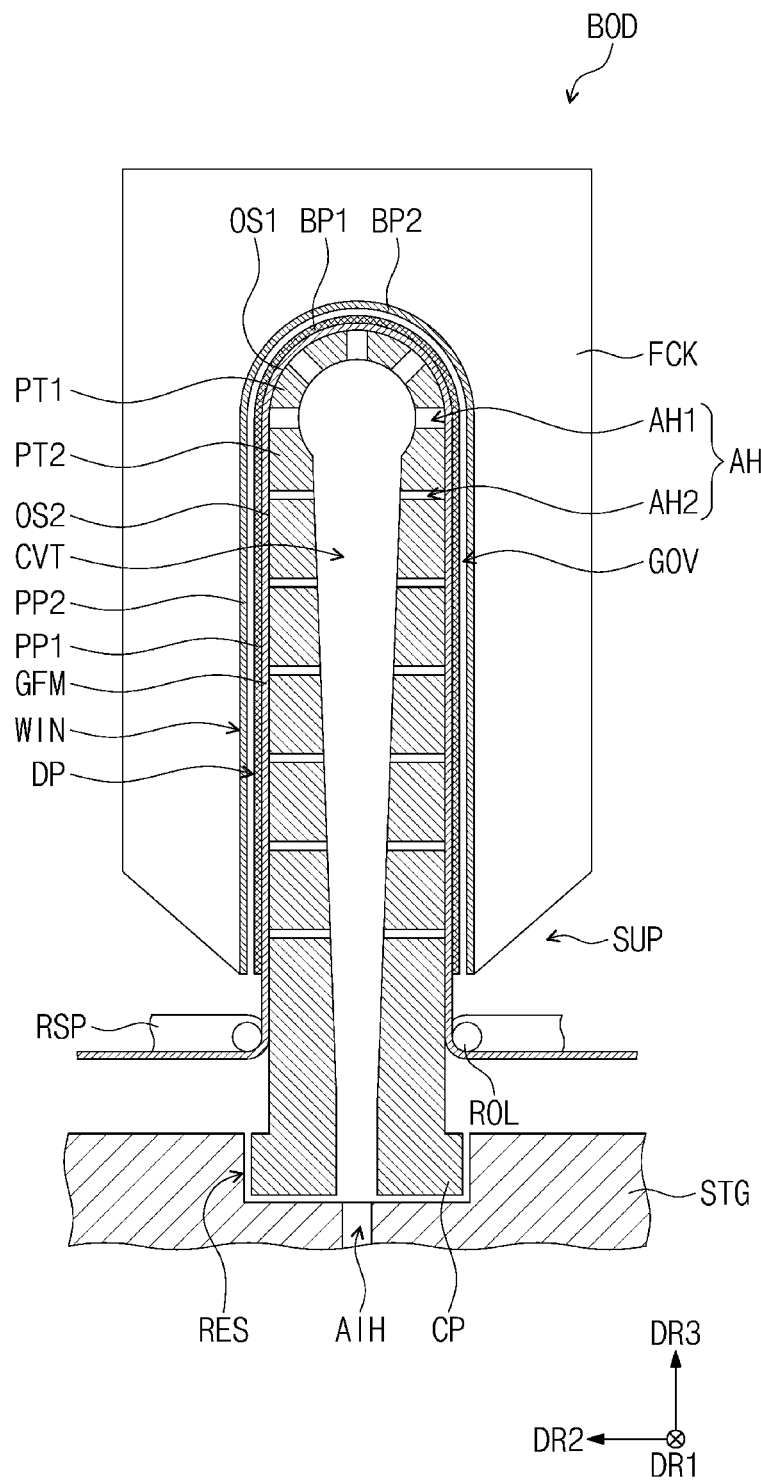

Referring to FIG. 2, the bonding apparatus BOD may be configured such that the display panel DP which may be bonded to the window WIN may be disposed on the support SUP, and that the window WIN may be disposed in the groove GOV of the window fixing chuck FCK. FIG. 19 below depicts a shape of the display panel DP disposed on the support SUP and a shape of the window WIN disposed in the groove GOV of the window fixing chuck FCK.

The display panel DP may not be directly disposed on the support SUP, but rather may be placed through a guide film GFM on the support SUP. For example, the guide film GFM may be prepared, and the display panel DP may be disposed on the guide film GFM. The guide film GFM may be disposed on the support SUP.

The guide film GFM may include a flexible plastic material. For example, the guide film GFM may include a plastic material, such as polyimide (PI) or polyethyleneterephthalate (PET).

The display panel DP may be a flexible display panel. The display panel DP according to an embodiment may be an emissive display panel, but the disclosure is not particularly limited thereto. For example, the display panel DP may be an organic light emitting display panel or a quantum-dot light emitting display panel. An emission layer of the organic light emitting display panel may include an organic light emitting material. An emission layer of the quantum-dot light emitting display panel may include a quantum-dot or a quantum-rod. The following will describe an example in which an organic light emitting display panel may be used as the display panel DP.

The window WIN may be disposed on the display panel DP. The window WIN may include glass. The window WIN may be defined as an ultrathin glass (UTG). The ultrathin glass may be a tempered glass and may have strong durability that may not be easily broken even when being subject to bending.

The window WIN may include a synthetic resin film in addition to glass. The window WIN may have a single-layered or multi-layered structure. For example, the window WIN may include either synthetic resin films that may be coupled to each other through an adhesive or a glass substrate with a plastic film coupled thereto through an adhesive.

An adhesive ADH may be disposed between the display panel DP and the window WIN. The adhesive ADH may include an optically clear adhesive (OCA), but no limitation is imposed on the material of the adhesive ADH.

The adhesive ADH may be disposed on a top surface of the display panel DP. The adhesive ADH may be attached to the top surface of the display panel DP, and thereafter, the window WIN may be adhered to the adhesive ADH. The adhesive ADH may bond the display panel DP and the window WIN to each other. The bonding apparatus BOD of FIG. 1 may be used to bond the display panel DP and the window WIN to each other.

After the display panel DP and the window WIN are bonded to each other, the guide film GFM may be separated from the display panel DP. Although not shown, an adhesive may be additionally disposed between the guide film GFM and the display panel DP, thereby attaching the guide film GFM to the display panel DP. The window WIN bonded to the display panel DP may protect the display panel DP against external scratches and impact.

Although not shown, the display panel DP and the window WIN may be provided therebetween with an input sensing part to detect external inputs and with an antireflective layer to prevent reflection of external light.

Figure 3:
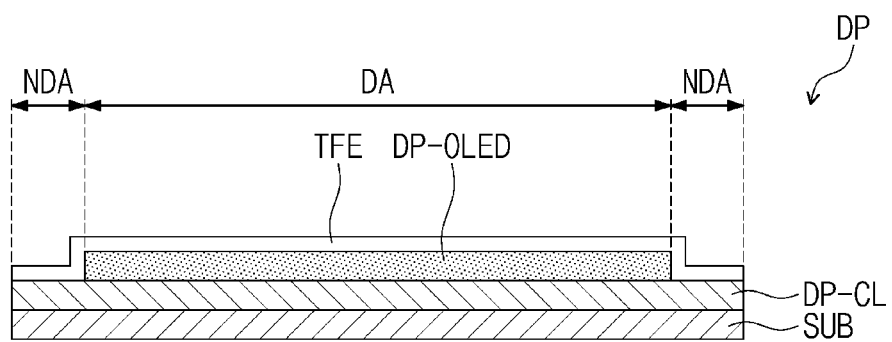
FIG. 3 illustrates a schematic cross-sectional view showing the display panel depicted in FIG. 2.
Figure 4:
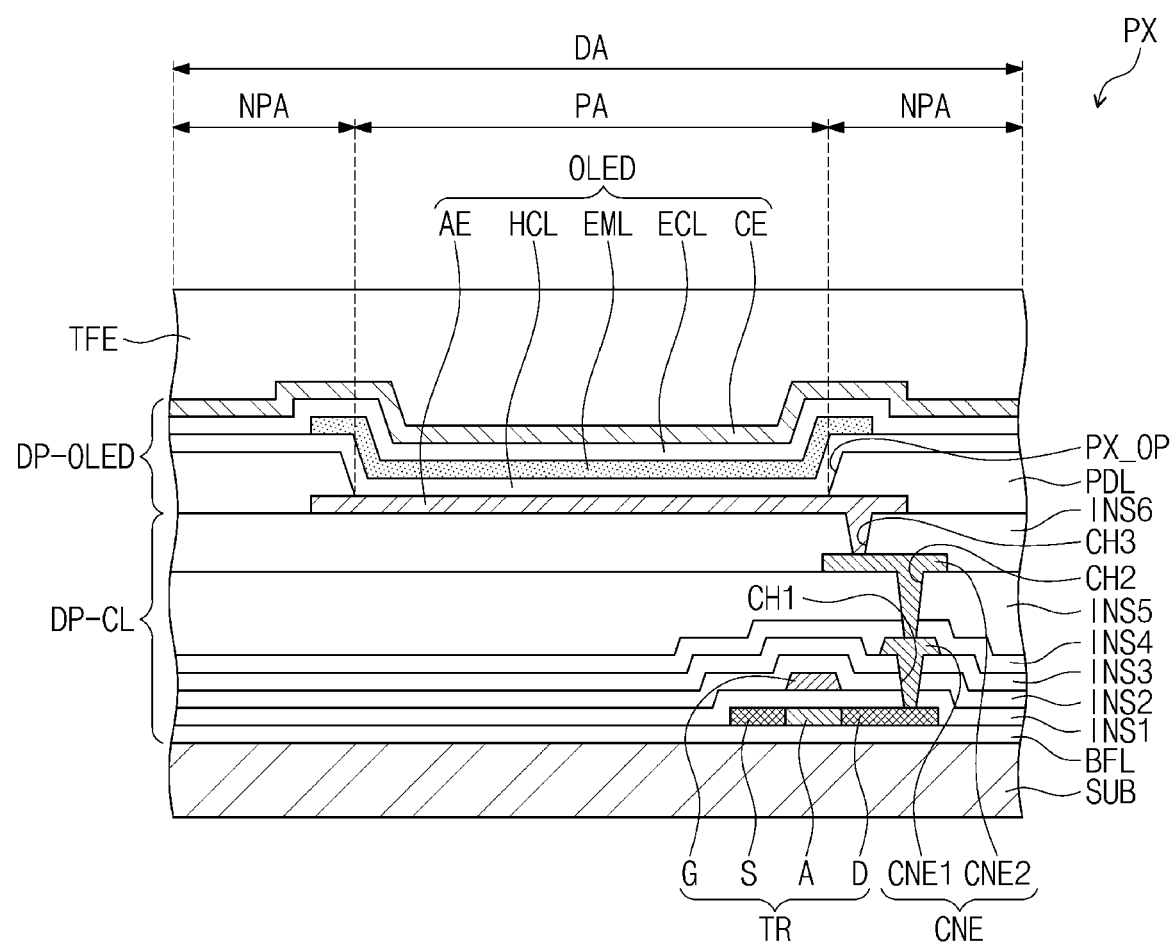
FIG. 4 illustrates a schematic cross-sectional view showing a single pixel disposed on a display element layer and a circuit element layer depicted in FIG. 3.

FIG. 3 illustrates a schematic cross-sectional view showing the display panel of FIG. 2. FIG. 4 illustrates a schematic cross-sectional view showing a single pixel disposed on a display element layer and a circuit element layer depicted in FIG. 3.

Referring to FIG. 3, the display panel DP may include a substrate SUB, a circuit element layer DP-CL disposed on the substrate SUB, a display element layer DP-OLED disposed on the circuit element layer DP-CL, and a thin-film encapsulation layer TFE disposed on the display element layer DP-OLED.

The substrate SUB may include a display region DA and a non-display region NDA around or adjacent to the display region DA. The substrate SUB may include a flexible plastic material, such as polyimide (PI). The display element layer DP-OLED may be disposed on or in the display region DA.

Pixels may be disposed on the circuit element layer DP-CL and the display element layer DP-OLED. Each of the pixels may include a transistor disposed on the circuit element layer DP-CL, and may also include a light emitting element disposed on the display element layer DP-OLED and electrically connected to the transistor.

The thin-film encapsulation layer TFE may be disposed on the circuit element layer DP-CL to cover or overlap the display element layer DP-OLED. The thin-film encapsulation layer TFE may include inorganic layers and an organic layer disposed between the inorganic layers. The inorganic layers may protect the pixels against moisture and/or oxygen. The organic layer may protect the pixels against foreign substances such as dust particles.

Referring to FIG. 4, a pixel PX may include a transistor TR and a light emitting element OLED. The light emitting element OLED may include a first electrode AE, a second electrode CE, a hole control layer HCL, an electron control layer ECL, and an emission layer EML. The first electrode AE may be an anode electrode, and the second electrode CE may be a cathode electrode.

The transistor TR and the light emitting element OLED may be disposed on the substrate SUB. Although a single transistor TR is illustrated by way of example, the pixel PX may substantially include at least one capacitor and transistors for driving the light emitting element OLED. The display region DA may include an emission region PA on which the light emitting element OLED may be disposed, and may also include a non-emission region NPA around or adjacent to the emission region PA.

A buffer layer BFL may be disposed on the substrate SUB, and the buffer layer BFL may be an inorganic layer. A semiconductor pattern may be disposed on the buffer layer BFL. The semiconductor pattern may include polysilicon. The disclosure, however, is not limited thereto, and the semiconductor pattern may include amorphous silicon or a metal oxide.

The semiconductor pattern may have electrical characteristics that may be changed according to whether the semiconductor pattern is doped or not doped. The semiconductor pattern may include a doped region and an undoped region. The doped region may be implanted with n-type or p-type impurities. The doped region may have conductivity greater than that of the undoped region, and may substantially serve as source and drain electrodes of the transistor TR. The undoped region may substantially correspond to an active area or region (or channel area or region) of the transistor TR.

The transistor TR may include a source S, an active A, and a drain D areas or regions that may be formed of the semiconductor pattern. A first dielectric layer INS1 may be disposed on the semiconductor pattern. The first dielectric layer INS1 may be provided or disposed thereon with a gate G of the transistor TR.

A second dielectric layer INS2 may be disposed on the gate G. A third dielectric layer INS3 may be disposed on the second dielectric layer INS2. The transistor TR and the light emitting element OLED may be provided or disposed therebetween with a connection electrode CNE that may electrically connect the transistor TR to the light emitting element OLED. The connection electrode CNE may include a first connection electrode CNE1 and a second connection electrode CNE2 on the first connection electrode CNE1.

The first connection electrode CNE1 may be disposed on the third dielectric layer INS3, and may be electrically connected to the drain D through a first contact hole CH1 defined in the first to third dielectric layers INS1 to INS3. A fourth dielectric layer INS4 may be disposed on the first connection electrode CNE1. A fifth dielectric layer INS5 may be provided or disposed on the fourth dielectric layer INS4. The second connection electrode CNE2 may be disposed on the fifth dielectric layer INS5. The second connection electrode CNE2 may be electrically connected to the first connection electrode CNE1 through a second contact hole CH2 defined in the fifth dielectric layer INS5.

A sixth dielectric layer INS6 may be disposed on the second connection electrode CNE2. The circuit element layer DP-CL may be defined to include layers from the buffer layer BFL to the fifth dielectric layer INS5. The first to sixth dielectric layers INS1 to INS6 may be inorganic or organic layers.

The first electrode AE may be disposed on the sixth dielectric layer INS6. The first electrode AE may be electrically connected to the second connection electrode CNE2 through a third contact hole CH3 defined in the sixth dielectric layer INS6. A pixel definition layer PDL may be disposed on the first electrode AE and the sixth dielectric layer INS6, and the pixel definition layer PDL may expose a portion of the first electrode AE. The pixel definition layer PDL may have an opening PX_OP that may expose the portion of the first electrode AE.

The hole control layer HCL may be disposed on the first electrode AE and the pixel definition layer PDL. The hole control layer HCL may be disposed in common on the emission region PA and the non-emission region NPA. The hole control layer HCL may include a hole transport layer and a hole injection layer.

The emission layer EML may be disposed on the hole control layer HCL. The emission layer EML may be disposed on a location that may correspond to the opening PX_OP. The emission layer EML may include one or more of an organic light-emitting material and an inorganic light-emitting material. The emission layer EML may generate one of a red light, a green light, and a blue light.

The electron control layer ECL may be disposed on the emission layer EML and the hole control layer HCL. The electron control layer ECL may be disposed in common on the emission region PA and the non-emission region NPA. The electron control layer ECL may include an electron transport layer and an electron injection layer.

The second electrode CE may be disposed on the electron control layer ECL. The second electrode CE may be disposed in common on pixels PX. The thin-film encapsulation layer TFE may be disposed on the light emitting element OLED. A section where the light emitting element OLED may be disposed may be defined as the display element layer DP-OLED.

A first voltage may be applied through the transistor TR to the first electrode AE, and a second voltage may be applied to the second electrode CE. Holes and electrons injected into the emission layer EML may combine with each other to produce excitons, and the light emitting element OLED may emit light as the excitons return to ground state.

Figure 5:
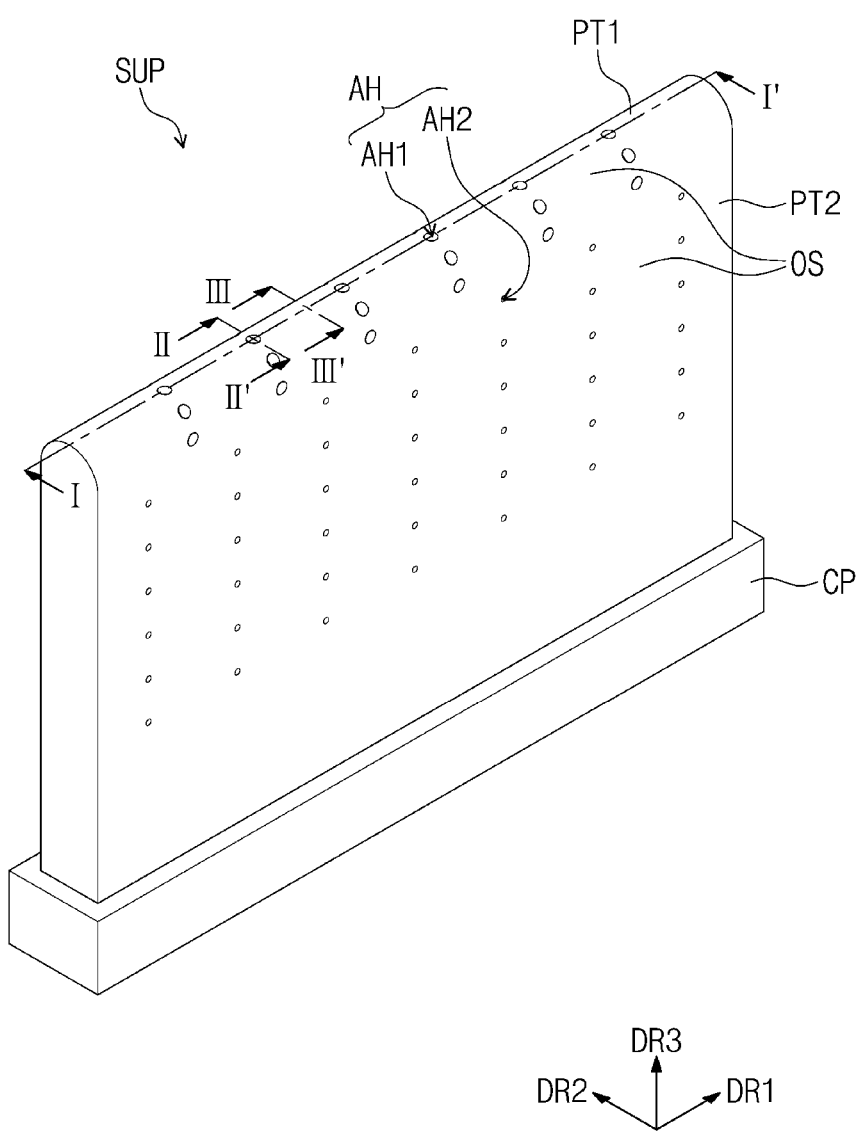
FIG. 5 illustrates an enlarged perspective view showing a support depicted in FIG. 1.
Figure 6A:
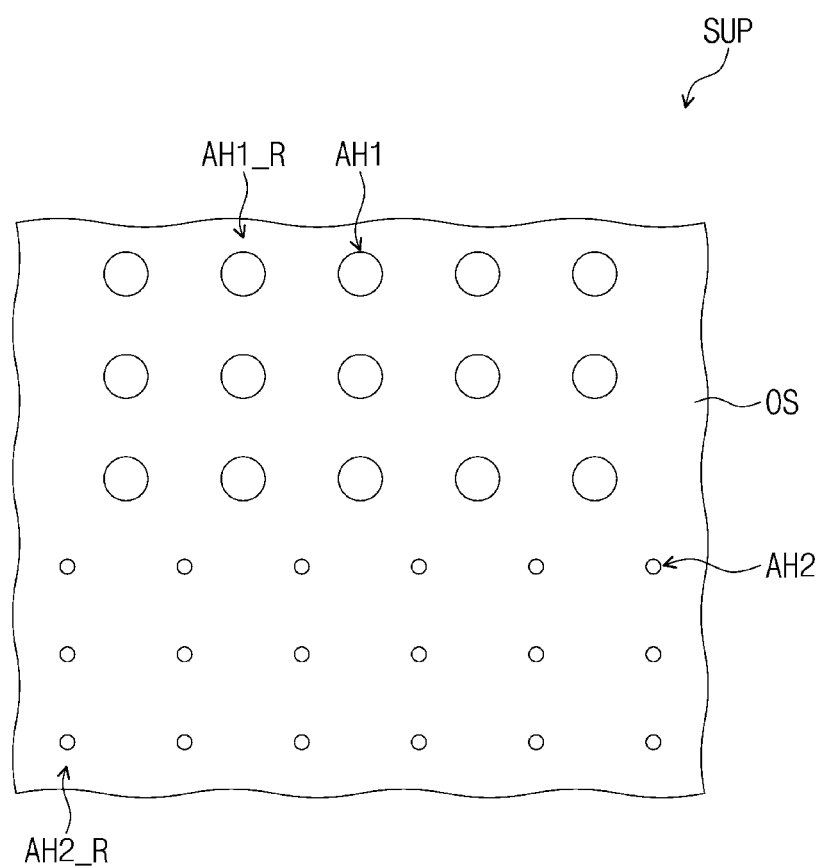
FIGS. 6A to 6C illustrate diagrams showing various shapes of through holes depicted in FIG. 5.
Figure 6B:
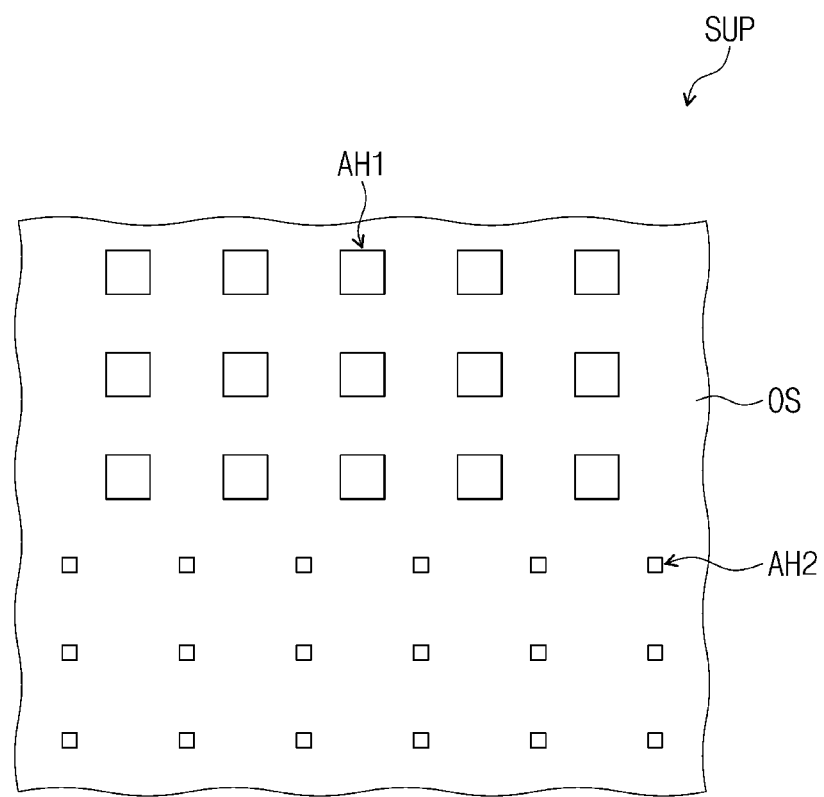
Figure 6C:
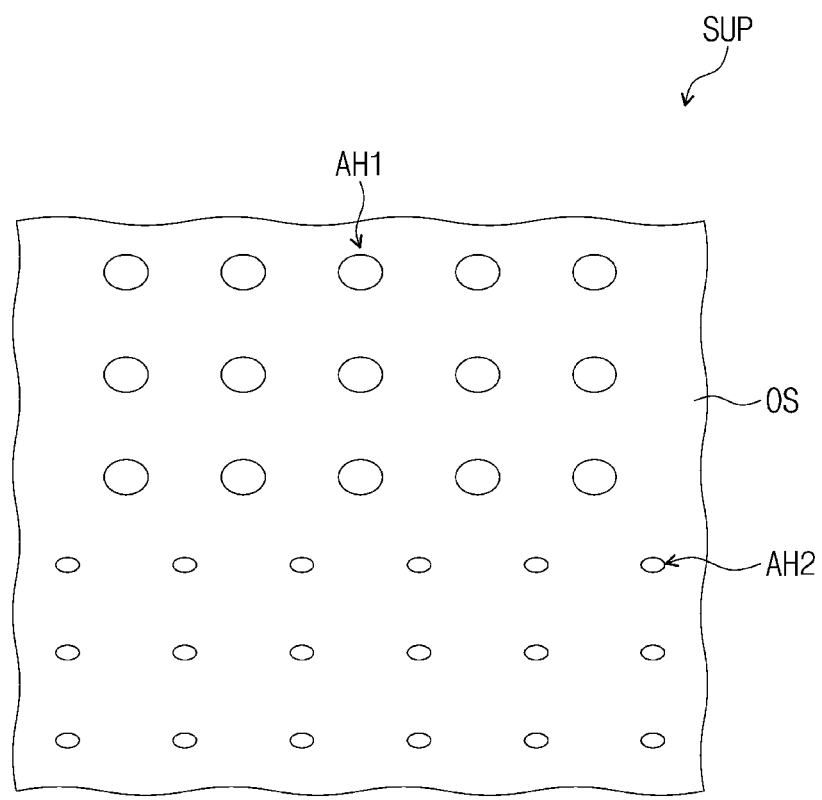

FIG. 5 illustrates an enlarged perspective view showing the support depicted in FIG. 1. FIGS. 6A to 6C illustrate diagrams showing various shapes of through holes depicted in FIG. 5.

By way of example, FIGS. 6A to 6C show enlarged illustrations of through holes AH that are unfolded flat.

Referring to FIG. 5, the support SUP may include a first part PT1, a connection part CP, and a second part PT2 disposed between the first part PT1 and the connection part CP. The second part PT2 may extend in the downward direction from the first part PT1. The first part PT1 may extend in the first direction DR1. When viewed in the first direction DR1, the first part PT1 may have a substantially curved surface that may be convex in the upward direction. The second part PT2 may have a substantially plate shape defined by the first direction DR1 and the third direction DR3. The second part PT2 may extend in the first direction D1.

The through holes AH may include first through holes AH1 defined in the first part PT1 and second through holes AH2 defined in the second part PT2. For example, as shown in FIG. 6A, the first and second through holes AH1 and AH2 may each have a substantially circular shape, but no limitation is imposed on the shape of the first and second through holes AH1 and AH2.

For example, the first and second through holes AH1 and AH2 may each have a substantially polygonal shape, such as a substantially tetragonal shape as shown in FIG. 6B. For another example, the first and second through holes AH1 and AH2 may each have a substantially oval shape as shown in FIG. 6C.

Referring back to FIG. 5, the first through holes AH1 may be defined on an outer surface of the first part PT1. For example, the first through holes AH1 may be defined on the curved surface of the first part PT1. The first through holes AH1 may be arranged in the first direction DR1 and the second direction DR2. The first through holes AH1 may be regularly arranged in a matrix shape or may be randomly arranged.

The second through holes AH2 may be defined on opposite side surfaces of the second part PT2 that may face each other in the second direction DR2. The second through holes AH2 may be arranged in the first direction DR1 and the third direction DR3. The second through holes AH2 may be regularly arranged in a matrix shape or may be randomly arranged.

Referring to FIGS. 5 and 6A, the first through holes AH1 and the second through holes AH2 may be alternately disposed in the first direction DR1. For example, first through holes AH1_R arranged in an $n^{th}$ column may be disposed alternately with second through holes AH2_R arranged in an $n^{th}$ column (where, n is a natural number). This, however, is an example, and no limitation is imposed on the arrangement position of the first and second through holes AH1 and AH2.

Referring again to FIG. 5, an externally exposed surface of the support SUP may be defined as an outer surface OS. The outer surface OS may be defined by the curved surface of the first part PT1 and the opposite side surfaces of the second part PT2 that may face each other in the second direction DR2. When the outer surface OS is viewed from outside the support SUP, the first through holes AH1 may have their sizes greater than those of the second through holes AH2. The number of the first through holes AH1 may be less than the number of the second through holes AH2. However, the disclosure is not limited thereto.

Figure 7A:
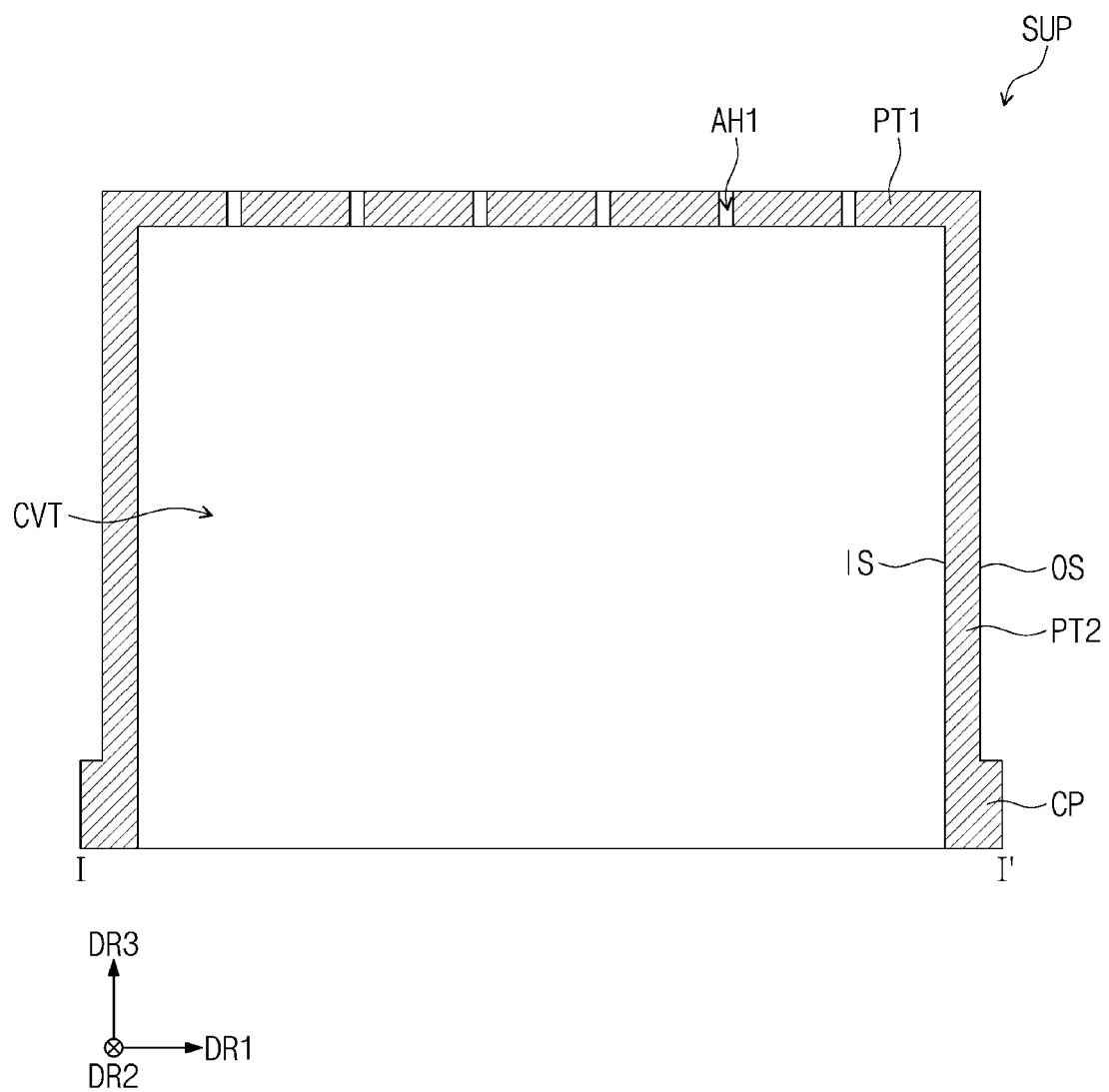
FIG. 7A illustrates a schematic cross-sectional view taken along line I-I' of FIG. 5.
Figure 7B:
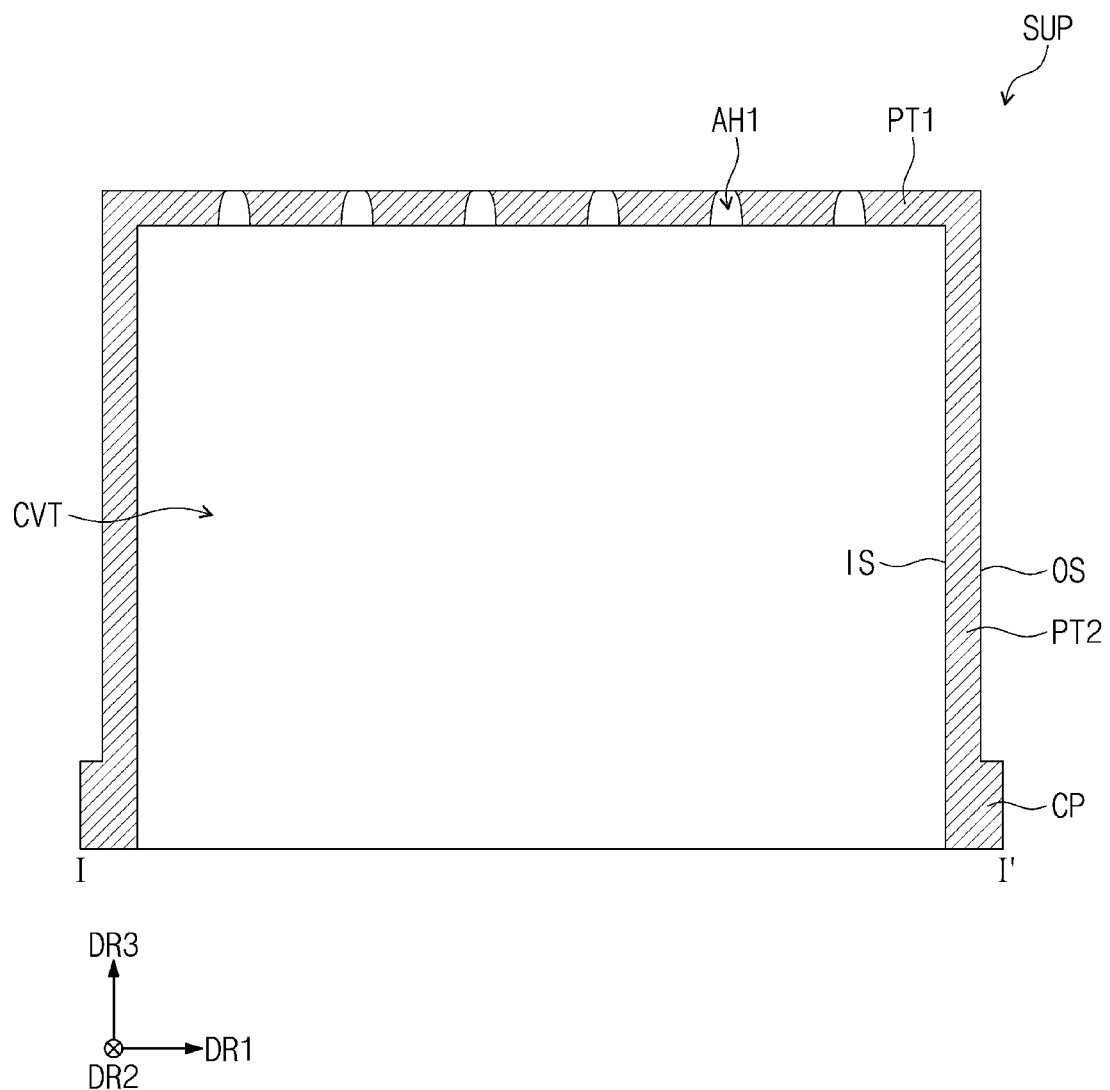
FIGS. 7B to 7D illustrate schematic cross-sectional views showing various shapes of first through holes.
Figure 7C:
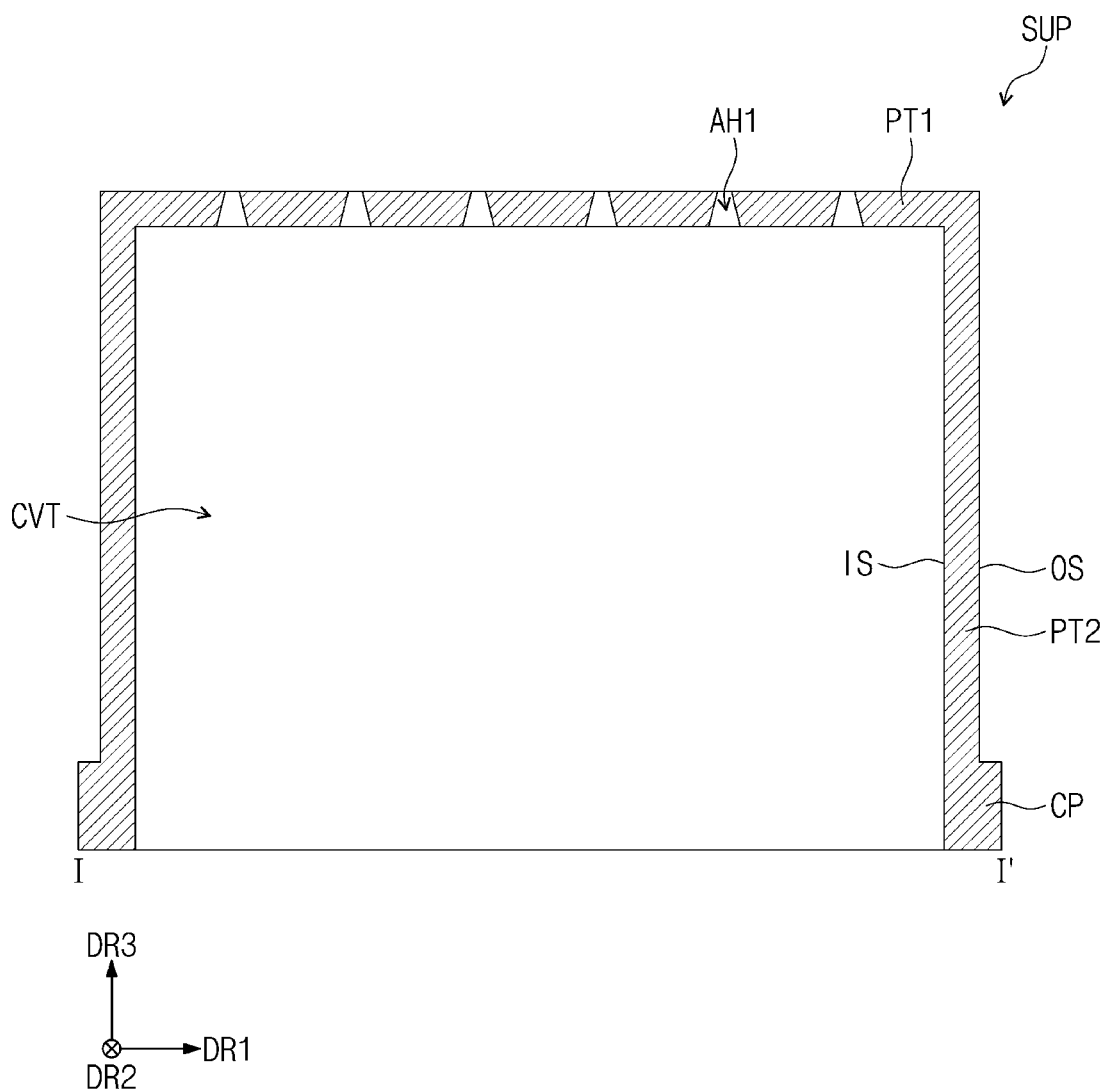
Figure 7D:
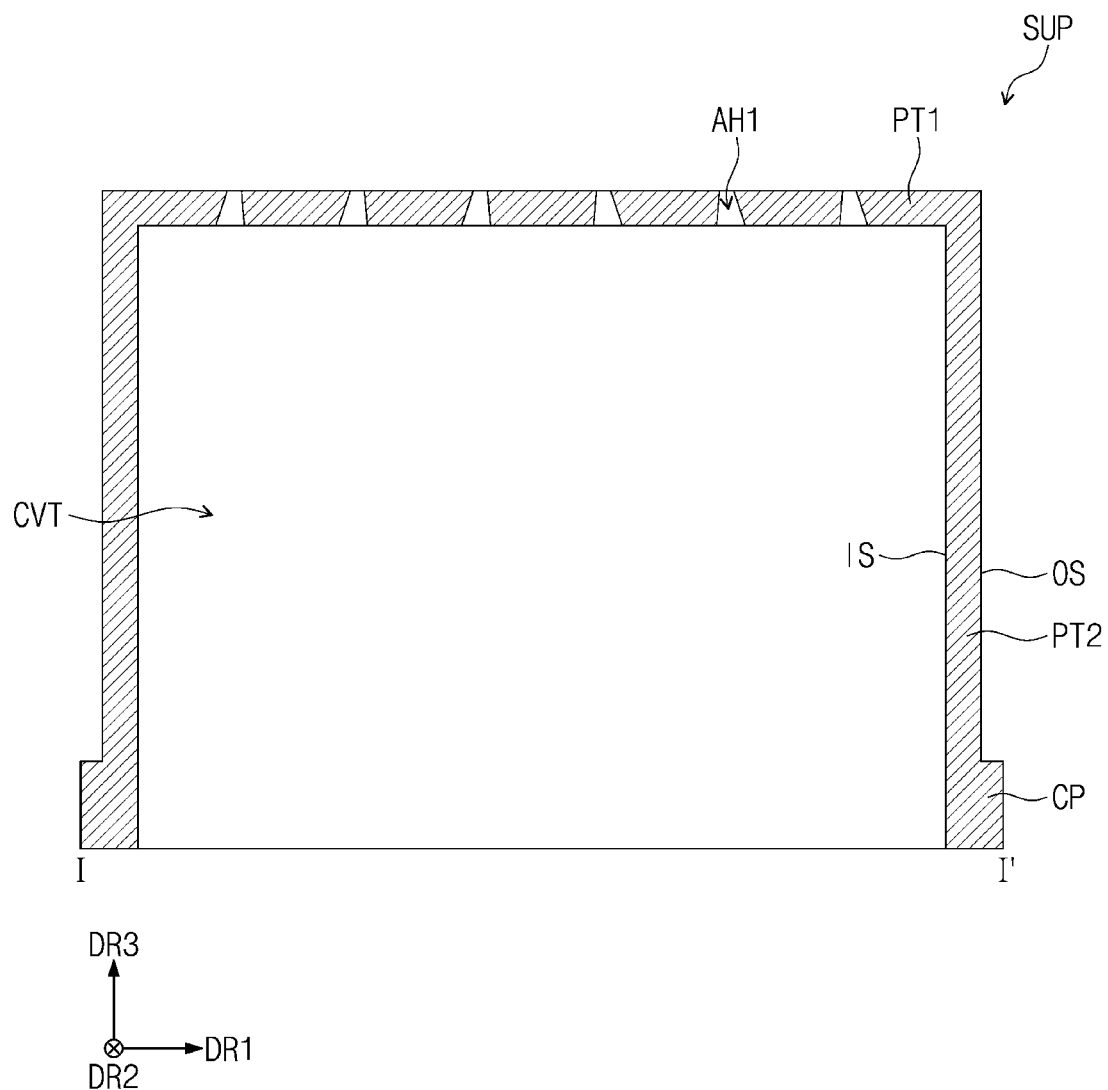

FIG. 7A illustrates a schematic cross-sectional view taken along line I-I' of FIG. 5. FIGS. 7B to 7D illustrate schematic cross-sectional views showing various shapes of the first through holes.

Referring to FIGS. 7A to 7D, the support SUP may have therein a cavity (or aperture) CVT that may be open in the downward direction. The cavity CVT may be continuously defined from the first part PT1 to the second part PT2, and may be open at the connection part CP.

The support SUP may have an inner surface IS defined to indicate a surface by which the cavity CVT may be defined. The outer surface OS of the support SUP may be defined to indicate a surface opposite to the inner surface IS of the support SUP.

The first through holes AH1 may be arranged in the first direction DR1 and may extend in the third direction DR3 from the cavity CVT. When viewed in the second direction DR2, the first through holes AH1 may each have a substantially tetragonal shape, but no limitation is imposed on the shape of the first through holes AH1.

For example, referring to FIG. 7B, each of the first through holes AH1 may have a substantially curved shape at left and right sides thereof. The first through holes AH1 may include widths that may decrease upwardly. Referring to FIG. 7C, the first through holes AH1 may each have a substantially trapezoidal shape that may be bilaterally symmetrical. Referring to FIG. 7D, the first through holes AH1 may each have a substantially trapezoidal shape that may be bilaterally asymmetrical.

Figure 8:
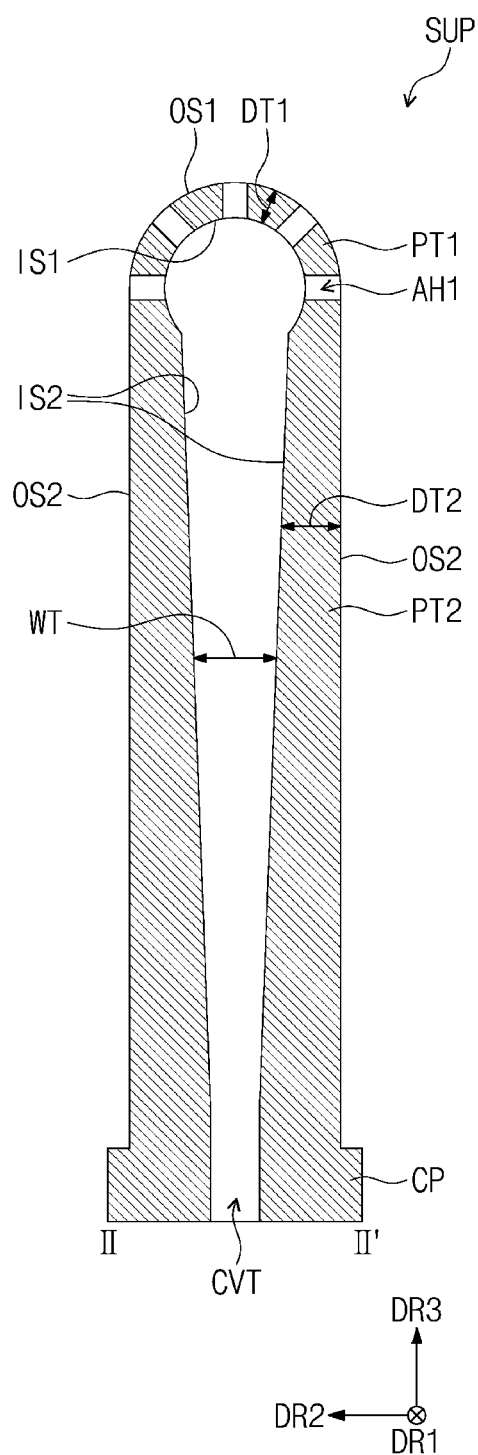
FIG. 8 illustrates a schematic cross-sectional view taken along line II-II' of FIG. 5.

FIG. 8 illustrates a schematic cross-sectional view taken along line II-II' of FIG. 5.

In the following description, the first part PT1 may have an inner surface defined as a first inner surface IS1 by which the cavity CVT may be defined, and may also have an outer surface defined as a first outer surface OS1 opposite to the inner surface of the first part PT1. The second part PT2 may have inner surfaces defined as second inner surfaces IS2 by which the cavity CVT may be defined, and may also have outer surfaces defined as second outer surfaces OS2 opposite to the inner surfaces of the second part PT2.

Referring to FIG. 8, the first through holes AH1 defined in the first part PT1 may extend from the cavity CVT. The first through holes AH1 may extend toward the first outer surface OS1 of the first part PT1, and may be open on the first outer surface OS1. When viewed in the first direction DR1, five first through holes AH1 may be defined in the support SUP, but no limitation is imposed on the number or arrangement of the first through holes AH1.

The first through holes AH1 may extend radially. For example, the first through holes AH1 may be arranged in a substantially fan shape. A spacing between the first through holes AH1 may increase as approaching the first outer surface OS1 from the first inner surface IS1.

The first through holes AH1 may be spaced apart from each other at a regular interval. The disclosure, however, is not limited thereto, and the first through holes AH1 may be spaced apart from each other at various intervals.

When viewed in the first direction DR1, the cavity CVT defined on the first part PT1 may have a substantially circular shape. The cavity CVT defined on the second part PT2 may extend in the third direction DR3. The cavity CVT defined on the second part PT2 may have a width WT in the second direction DR2, and for example, the width WT may decrease in the downward direction. The cavity CVT defined on the first part PT1 may have a maximum width in the second direction DR2, which maximum width may be greater than that of the cavity CVT defined on the second part PT2.

The connection part CP may define a lower portion of the support SUP, and may be disposed in the recession RES depicted in FIG. 1. The width WT of the cavity CVT may be constantly maintained at the connection part CP, but the disclosure is not limited thereto. The second inner surfaces IS2 may be defined as inner side surfaces of the second part PT2 that may face each other in the second direction DR2. The second outer surfaces OS2 may be defined as outer side surfaces of the second part PT2 that may be opposite to each other in the second direction DR2. The outer side surfaces of the second part PT2 may be defined as opposite side surfaces of the second part PT2.

When viewed in the first direction DR1, the first inner surface IS1 may be defined as a curved surface that may be concave upwardly. When viewed in the first direction DR1, the first outer surface OS1 may be defined as a curved surface that may be convex upwardly. The second outer surfaces OS2 may each have a plane defined by the first direction DR1 and the third direction DR3. The second inner surfaces IS2 may each have an inclined surface that may be inclined at a certain or predetermined angle relative to the third direction DR3. The second inner surfaces IS2 may have substantially symmetrical shapes with each other.

Hereinafter, FIG. 8 explains by way of example one or a second outer surface OS2 and its opposite second inner surface IS2 selected from the second outer surfaces OS2 and the second inner surfaces IS2.

The second part PT2 may have a thickness greater than that of the first part PT1 and may extend in the downward direction from the first part PT1. For example, a first distance DT1 between the first inner surface IS1 and the first outer surface OS1 may be less than a second distance DT2 between the second inner surface IS2 and the second outer surface OS2.

The thickness of the first part PT1 may be defined as the first distance DT1, and the thickness of the second part PT2 may be defined as the second distance DT2. The first distance DT1 may be defined to indicate a distance measured in a direction normal to the first outer surface OS1. The second distance DT2 may be defined to indicate a distance measured in the second direction DR2.

The second distance DT2 may increase as approaching a lower portion of the second part PT2 from an upper portion of the second part PT2, which upper portion may be adjacent to the first part PT1. In this sense, the thickness of the second part PT2 may increase in the downward direction.

Figure 9:
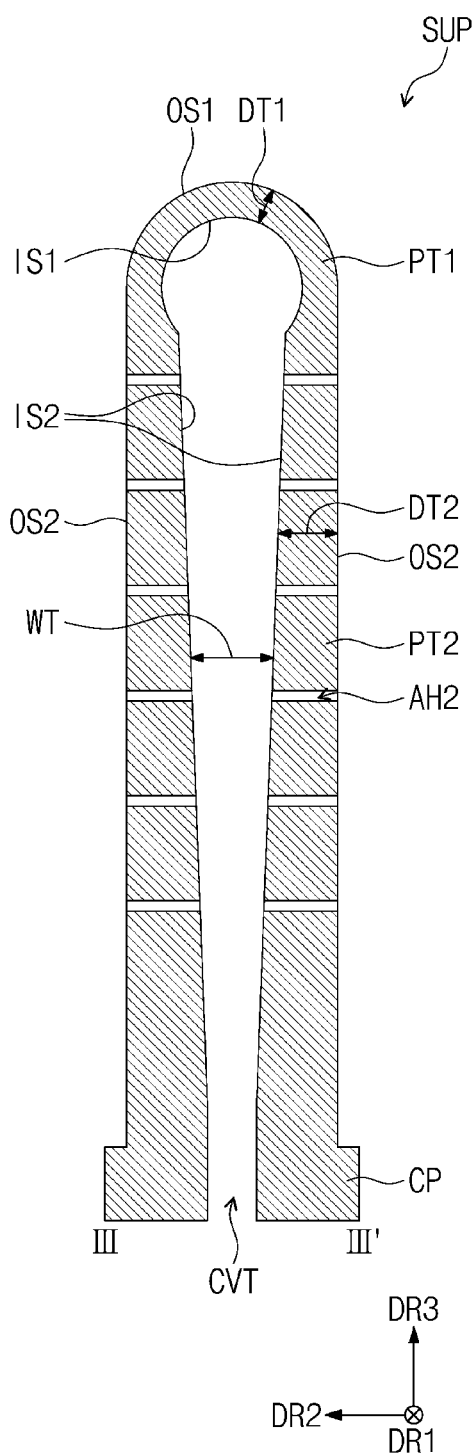
FIG. 9 illustrates a schematic cross-sectional view taken along line III-III' of FIG. 5.

FIG. 9 illustrates a schematic cross-sectional view taken along line of FIG. 5.

Referring to FIG. 9, the second through holes AH2 defined in the second part PT2 may extend from the cavity CVT. The second through holes AH2 may extend toward the second outer surfaces 052 and may be open on the second outer surfaces OS2.

The second through holes AH2 may extend in the second direction DR2 and may be arranged in the third direction DR3. The disclosure, however, is not limited thereto, and the second through holes AH2 may extend in a direction inclined to the second direction DR2.

The second through holes AH2 may be spaced apart from each other at a regular interval in the third direction DR3. The disclosure, however, is not limited thereto, and the second through holes AH2 may be spaced apart from each other at various intervals.

As the thickness of the second part PT2 increases in the downward direction, the second through holes AH2 may have their lengths that may increase as approaching the lower portion of the second part PT2 from the upper portion of the second part PT2.

Figure 10:
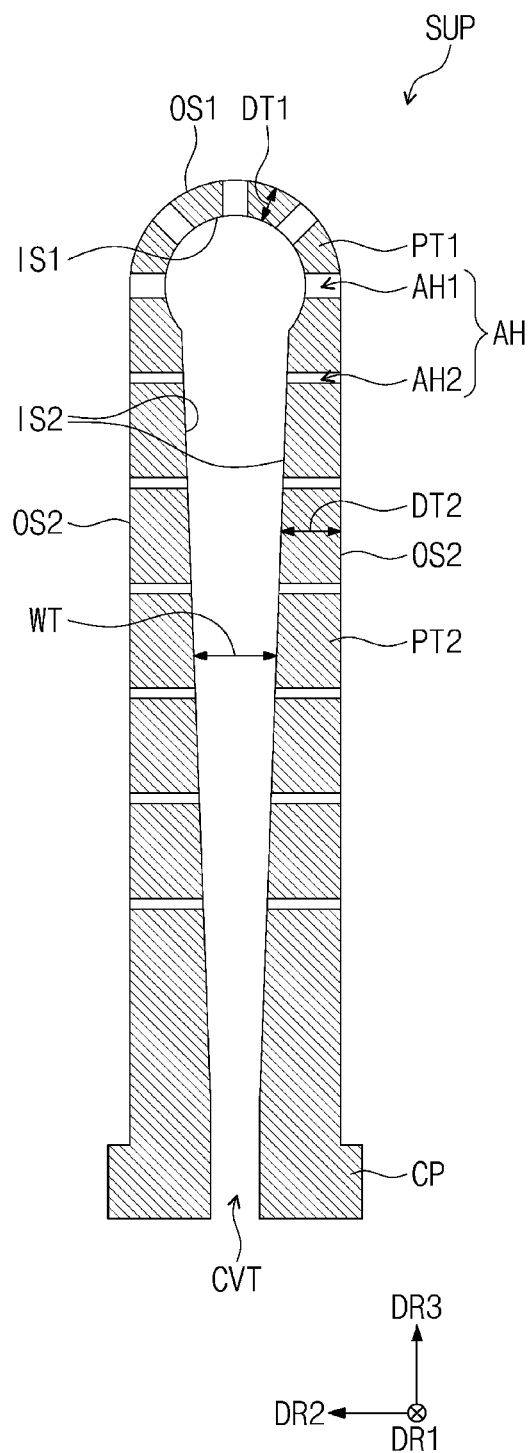
FIG. 10 illustrates a schematic cross-sectional view showing both a first part depicted in FIG. 8 and a second part depicted in FIG. 9.
Figure 11:
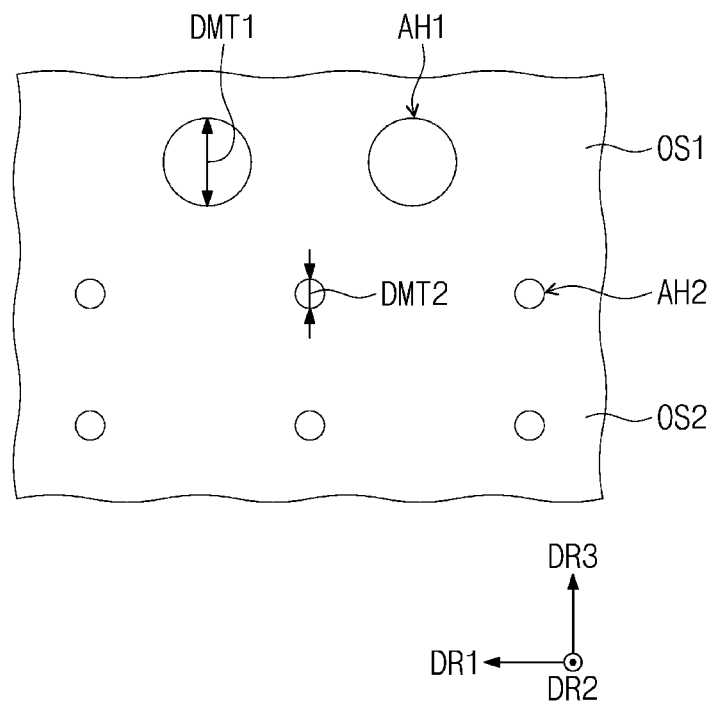
FIG. 11 illustrates an enlarged diagram showing first and second holes when viewed from first and second outer surfaces.
Figure 12:
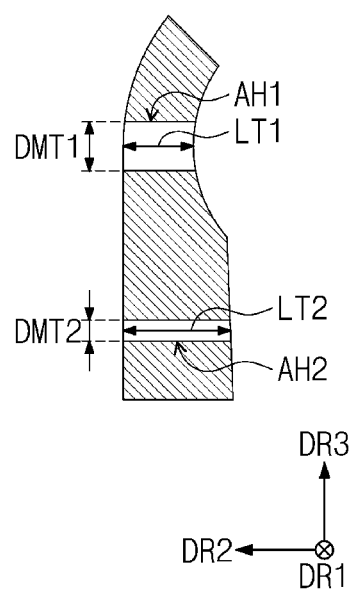
FIG. 12 illustrates an enlarged schematic cross-sectional view showing a first hole and a second hole that neighbor each other on the schematic cross-sectional view of FIG. 10.

FIG. 10 illustrates a schematic cross-sectional view showing both the first part depicted in FIG. 8 and the second part depicted in FIG. 9. FIG. 11 illustrates an enlarged diagram showing the first and second holes viewed from the first and second outer surfaces. FIG. 12 illustrates an enlarged schematic cross-sectional view showing the first hole and the second hole that may neighbor each other on the schematic cross-sectional view of FIG. 10.

Referring to FIG. 10, the second through holes AH2 may be disposed lower than the first through holes AH1. An interval between the first through holes AH1 may be different from an interval between the second through holes AH2. For example, the interval between the first through holes AH1 may be less than the interval between the second through holes AH2. The disclosure, however, is not limited thereto, and the interval between the first through holes AH1 may be the same as the interval between the second through holes AH2.

The interval between the first through holes AH1 may be defined to refer to a spacing between two neighboring or adjacent first through holes AH1. The interval between the second through holes AH2 may be defined to refer to a spacing between two neighboring or adjacent second through holes AH2.

Referring to FIGS. 10 and 11, the first through holes AH1 may have their sizes greater than those of the second through holes AH2. When the first outer surface OS1 is viewed from outside, the sizes of the first through holes AH1 may be defined to indicate areas of the first through holes AH1. Alternatively, when viewed in extending directions of the first through holes AH1, the sizes of the first through holes AH1 may be defined to indicate areas of the first through holes AH1.

Referring to FIG. 11, the areas of the first through holes AH1 may each be defined as a planar area of the first through hole AH1. As the first through hole AH1 has a substantially circular shape, the area of the first through hole AH1 may be $\pi(DMT1/2)^2$ when the first through hole AH1 has a first diameter DMT1.

Referring back to FIGS. 10 and 11, when the second outer surfaces OS2 are viewed from outside, the sizes of the second through holes AH2 may be defined to indicate areas of the second through holes AH2. Alternatively, when viewed in the second direction DR2 or extending directions of the second through holes AH2, the sizes of the second through holes AH2 may be defined to indicate areas of the second through holes AH2.

Referring back to FIG. 11, the areas of the second through holes AH2 may each be defined as a planar area of the second through hole AH2. As the second through hole AH2 has a substantially circular shape, the area of the second through hole AH2 may be $\pi(DMT2/2)^2$ when the second through hole AH2 has a second diameter DMT2.

The first diameter DMT1 may be greater than the second diameter DMT2. Therefore, the area of each of the first through holes AH1 may be greater than the area of each of the second through holes AH2.

Referring to FIGS. 10 and 12, the sizes of the first through holes AH1 may be defined as the thicknesses of the first through holes AH1. The sizes of the second through holes AH2 may be defined as the thicknesses of the second through holes AH2. The thickness may be defined to indicate a value measured in a direction perpendicular to the extending direction of each of the first and second through holes AH1 and AH2.

Referring to FIG. 12, the value measured in a direction perpendicular to the extending direction of the first through hole AH1 may be defined as substantially the first diameter DMT1 of the first through hole AH1. The value measured in a direction perpendicular to the extending direction of the second through hole AH2 may be defined as substantially the second diameter DMT2 of the second through hole AH2. As the first diameter DMT1 may be greater than the second diameter DMT2, the thickness of the first through hole AH1 may be greater than the thickness of the second through hole AH2.

The first through hole AH1 may have a length LT1 less than a length LT2 of the second through hole AH2. The length LT1 of the first through hole AH1 may be substantially the same as the first distance DT1, and the length LT2 of the second through hole AH2 may be substantially the same as the second distance DT2. The length LT1 of the first through hole AH1 may be defined as a distance measured in the extending direction of the first through hole AH1. The length LT2 of the second through hole AH2 may be defined as a distance measured in the second direction DR2 or the extending direction of the second through hole AH2.

Referring back to FIG. 10, the first through holes AH1 may radially extend while having a uniform size. The disclosure, however, is not limited thereto, and the first through holes AH1 may radially extend while having different sizes. The second through holes AH2 may extend in the second direction DR2 while having a uniform size. The disclosure, however, is not limited thereto, and the second through holes AH2 may extend in the second direction DR2 while having different sizes.

FIGS. 13 to 21 illustrate perspective and schematic cross-sectional views showing a method of fabricating a display device using the bonding apparatus depicted in FIG. 1.

Figure 20:
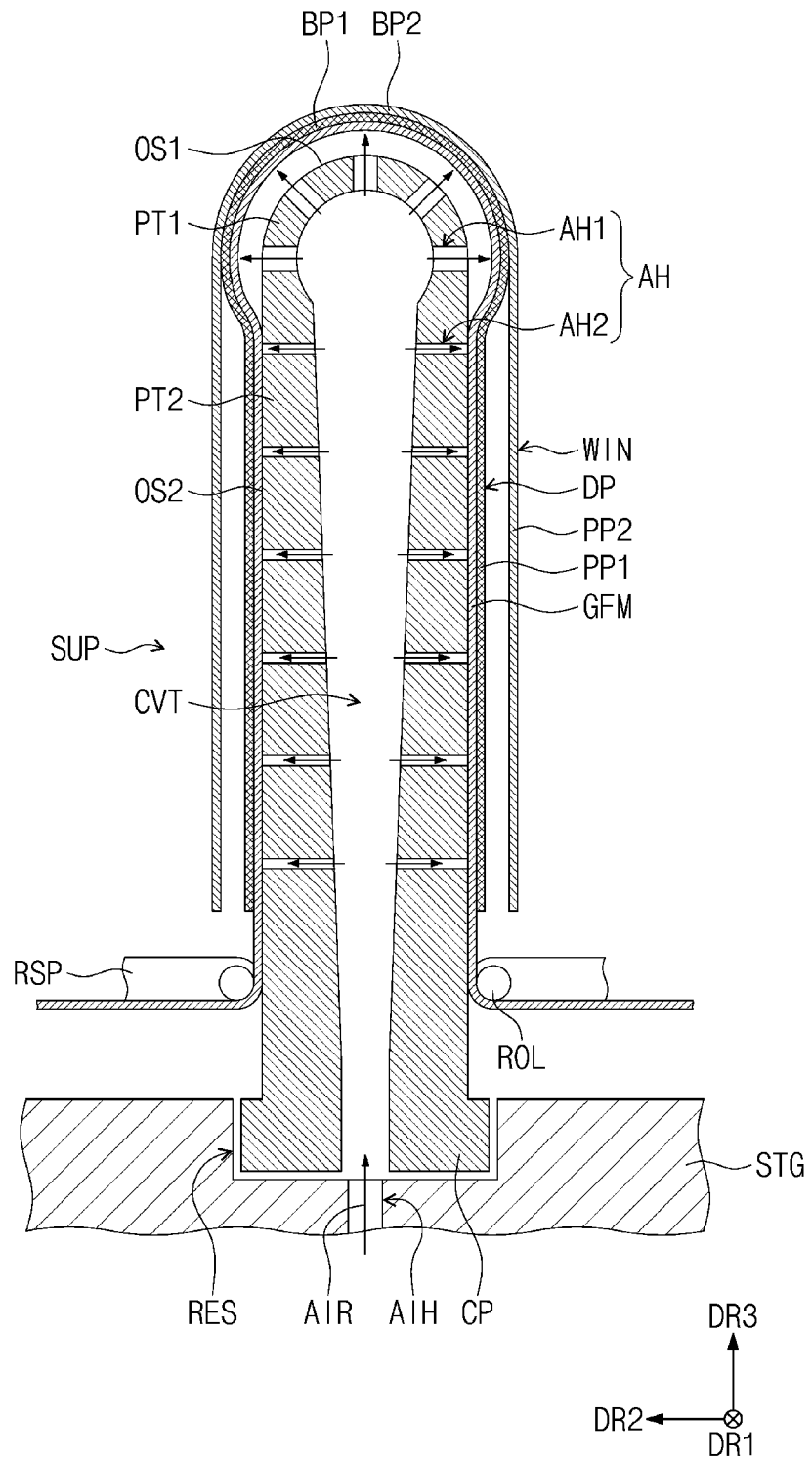
Figure 21:
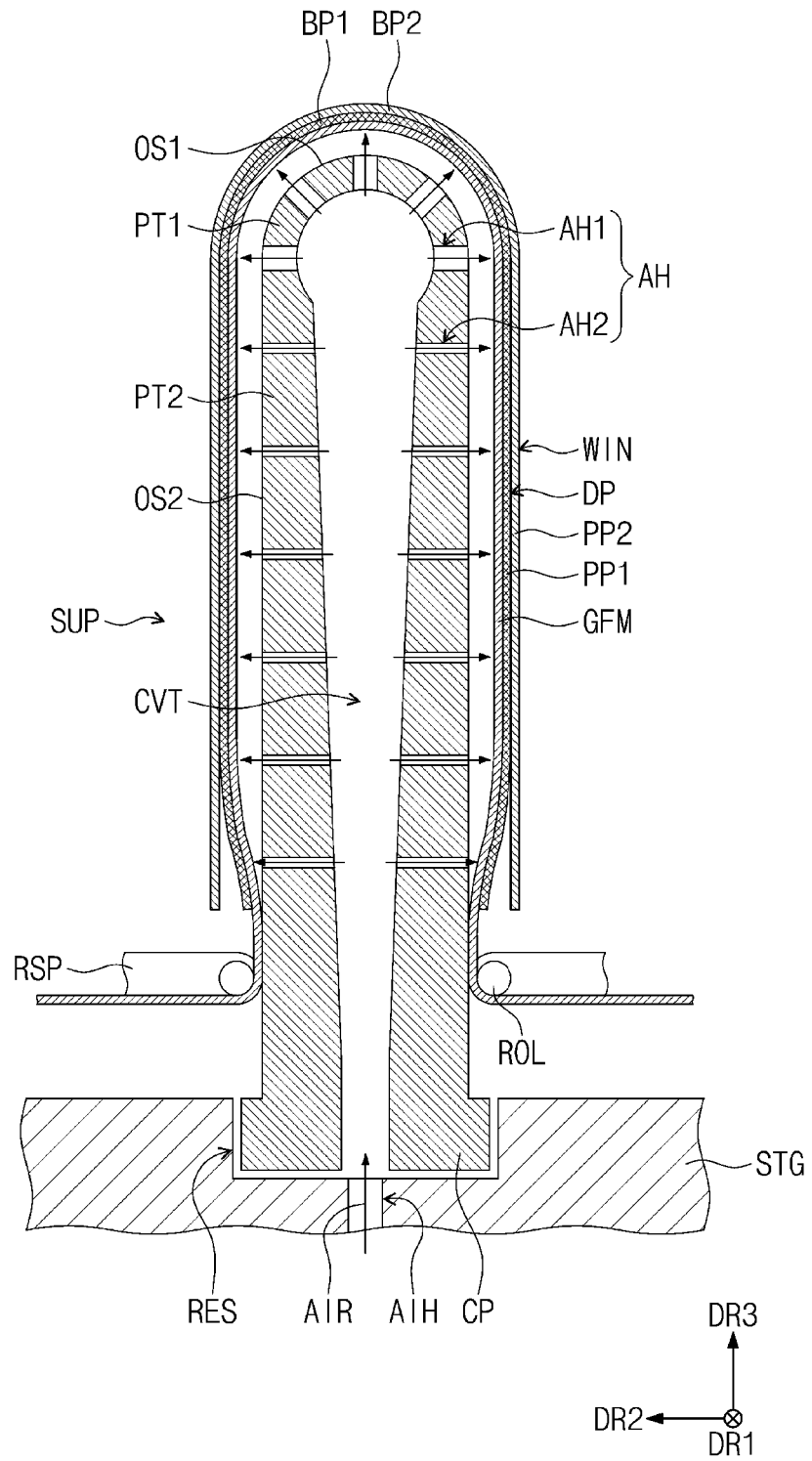

By way of example, FIGS. 13 to 21 show an illustration of the display panel DP and the guide film GFM, but omit an illustration of the adhesive ADH. For example, FIGS. 20 and 21 show an enlarged illustration of the support SUP, but omit an illustration of the window fixing chuck FCK.

Figure 13:
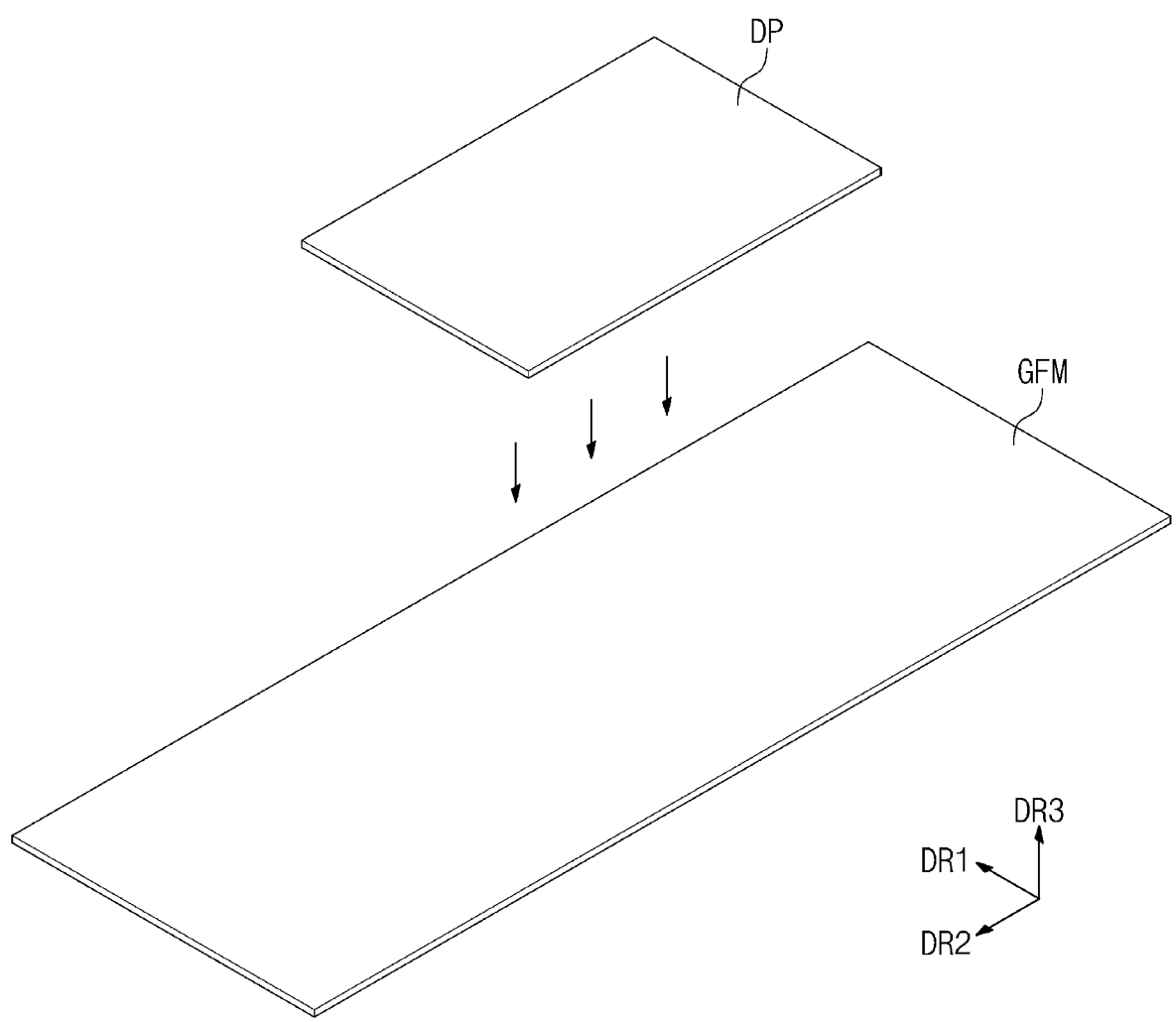
FIGS. 13 to 21 illustrate perspective and schematic cross-sectional views showing a method of fabricating a display device using the bonding apparatus depicted in FIG. 1.

Referring to FIG. 13, when viewed in the second direction DR2, the guide film GFM may have a length greater than that of the display panel DP. The display panel DP may be disposed on and bonded to the guide film GFM. The bonding between the guide film GFM and the display panel DP may be performed at a first process chamber (not shown). Although not shown, the adhesive ADH may be disposed on the display panel DP. For example, an adhesive may be used to attach the display panel DP to the guide film GFM.

A second process chamber (not shown) may receive the guide film GFM and the display panel DP that may be bonded to each other. The second process chamber may perform a bonding process to bond the window WIN to the display panel DP. The following processes may all be performed substantially together at the second process chamber.

Figure 14:
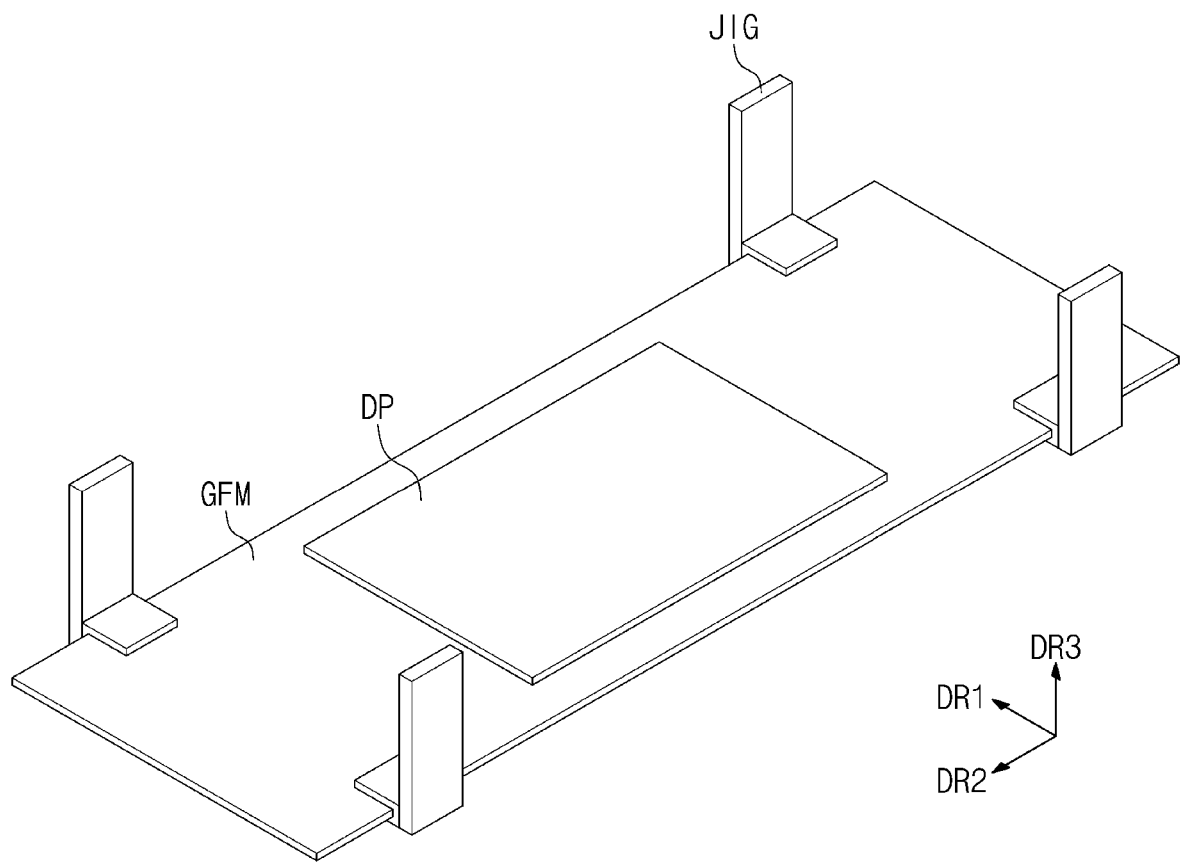

Referring to FIG. 14, jigs JIG may be provided and disposed on opposite ends of the guide film GFM that may face each other in the second direction DR2. The jigs JIG may hold opposite sides of the guide film GFM that may face each other in the first direction DR1. The jigs JIG may carry the guide film GFM.

Figure 15:
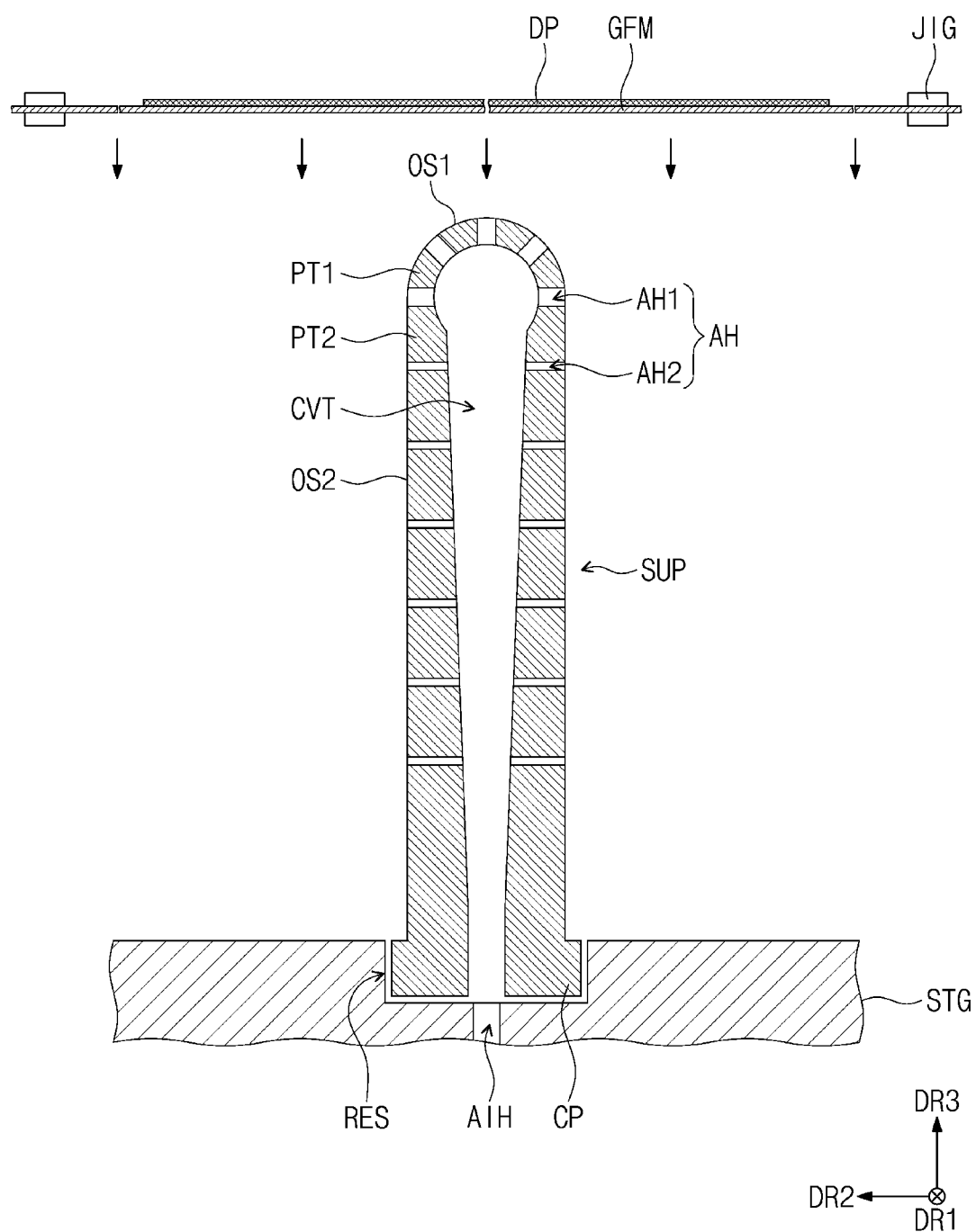

Referring to FIG. 15, the jigs JIG may cause the guide film GFM to move onto the support SUP. The jigs JIG may move downwardly to provide the guide film GFM on the support SUP.

Figure 16:
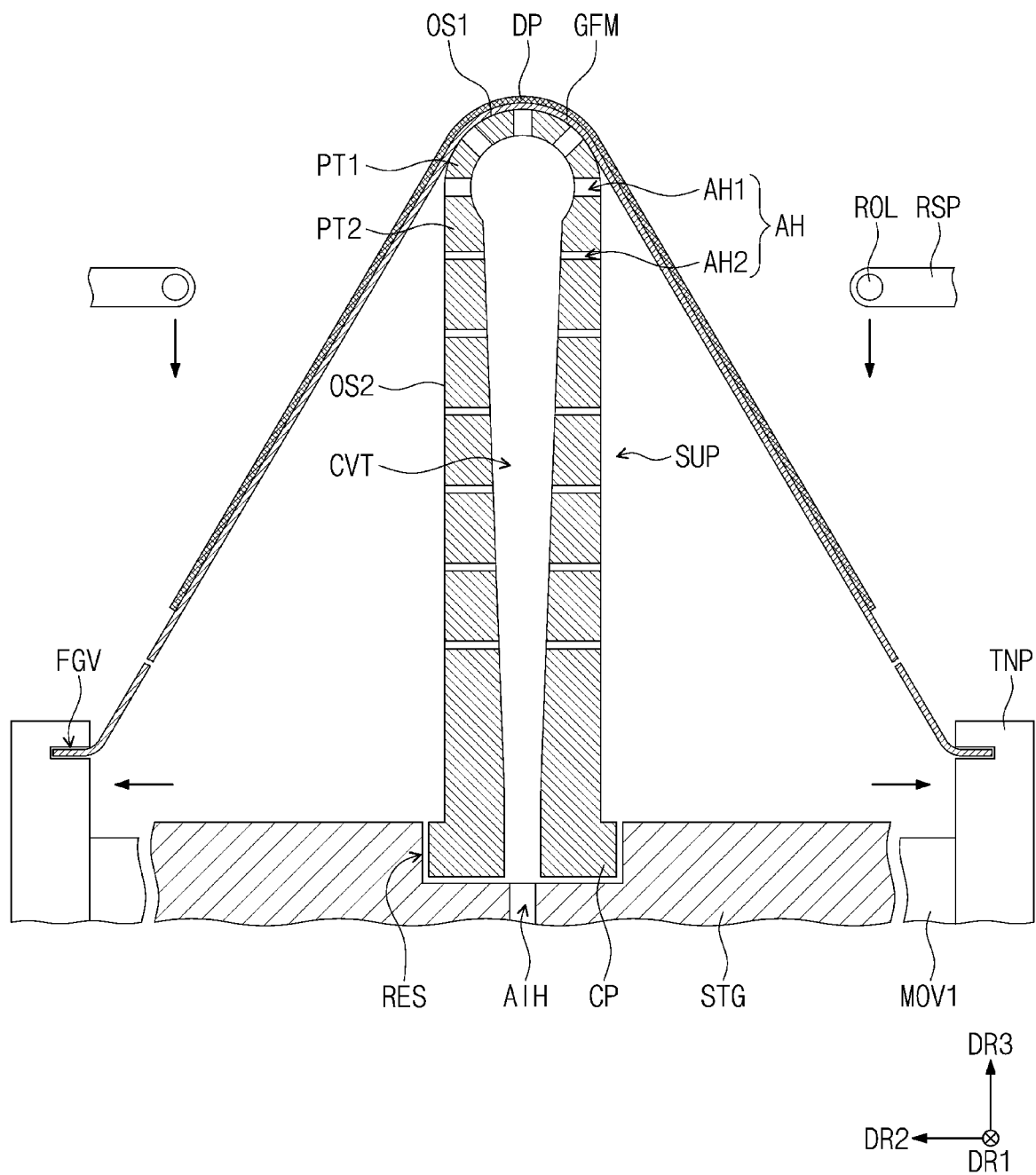

Referring to FIGS. 15 and 16, the jigs JIG may cause the guide film GFM to move downwardly, and the first part PT1 may be provided thereon with a portion of the guide film GFM, which portion may overlap a central portion of the display panel DP. The first outer surface OS1 may contact the portion of the guide film GFM, which portion may overlap the central portion of the display panel DP. Therefore, the central portion the display panel DP may be adjacent to the first outer surface OS1.

The jigs JIG may cause the opposite sides of the guide film GFM to move downwardly to be anchored into the fixing grooves FGV defined on the tension parts TNP. Thereafter, the jigs JIG may be removed from the guide film GFM.

The opposite sides of the guide film GFM may be fixed to the fixing grooves FGV. Although not shown, the fixing grooves FGV may have therein fixing units (for example, screws for pressing the guide film) to fix the opposite sides of the guide film GFM. The first moving parts MOV1 may drive the tension parts TNP to move away from each other in the second direction DR2 and to unfold the guide film GFM into a flat state.

Figure 17:
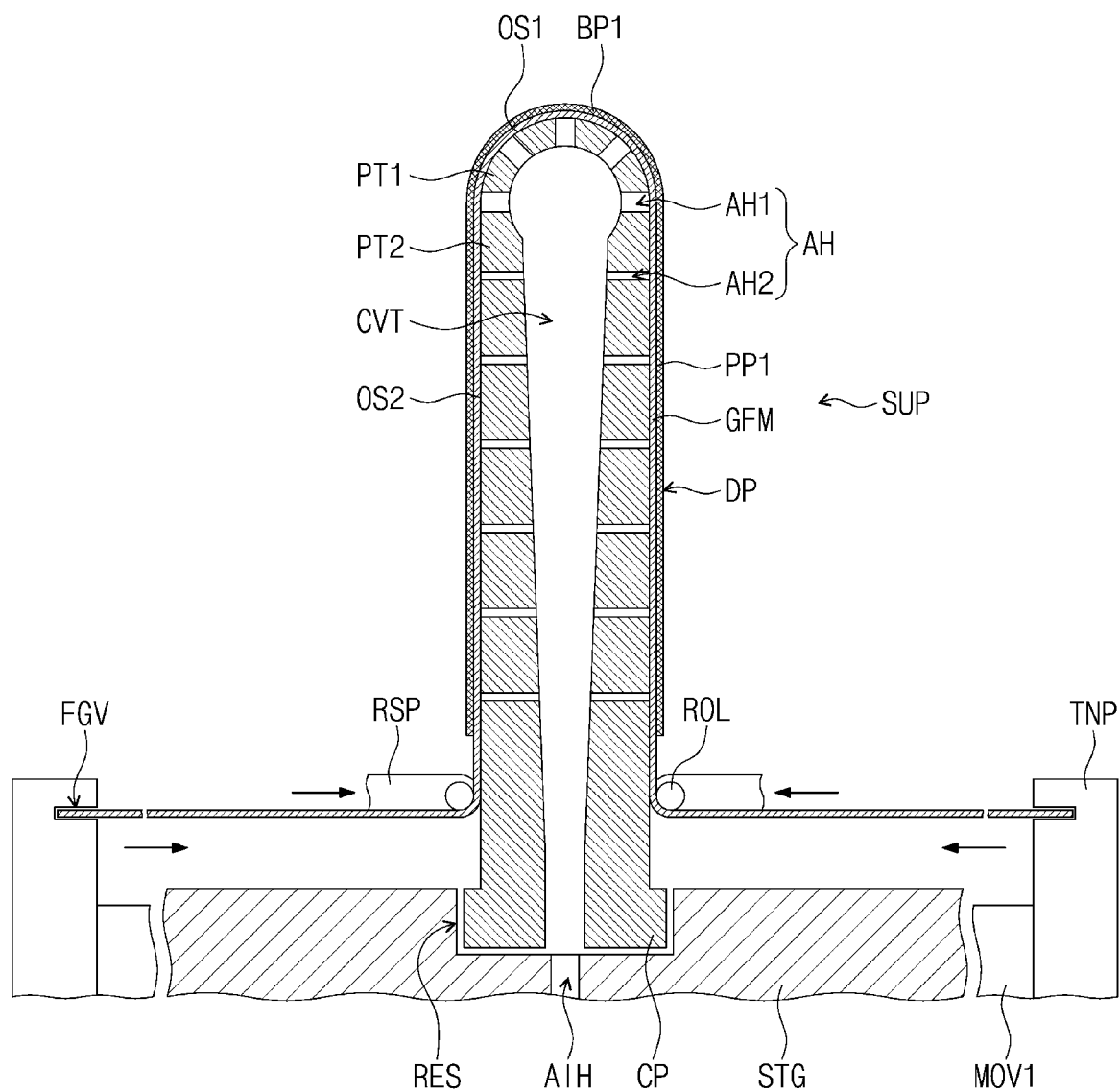

Referring to FIGS. 16 and 17, the rollers ROL may move in the third direction DR3 and the second direction DR2. As discussed above, the second moving part MOV2 may drive the rollers ROL to move in the third direction DR3, and the third moving parts MOV3 may drive the rollers ROL to move in the second direction DR2.

The rollers ROL may be disposed adjacent to a location between the connection part CP and a lowermost one of the second through holes AH2. The rollers ROL may be placed close to the second outer surfaces OS2.

The rollers ROL may move the guide film GFM while contacting the guide film GFM. The rollers ROL may drive portions of the guide film GFM that may be adjacent to the display panel DP to move toward the location between the connection part CP and the lowermost one of the second through holes AH2.

The rollers ROL may force the guide film GFM to move toward and contact the second outer surfaces OS2. The display panel DP may be upwardly spaced apart from the rollers ROL. Substantially, the rollers ROL may allow the display panel DP to have a position adjacent to the second outer surfaces OS2.

As the rollers ROL drive the guide film GFM to move, the tension parts TNP may also move together with the rollers ROL. Because the rollers ROL move toward the support SUP and become close to each other, the first moving parts MOV1 may drive the tension parts TNP to move close to each other in the second direction DR2.

In FIGS. 18 to 21 below, the tension parts TNP will be omitted.

Figure 18:
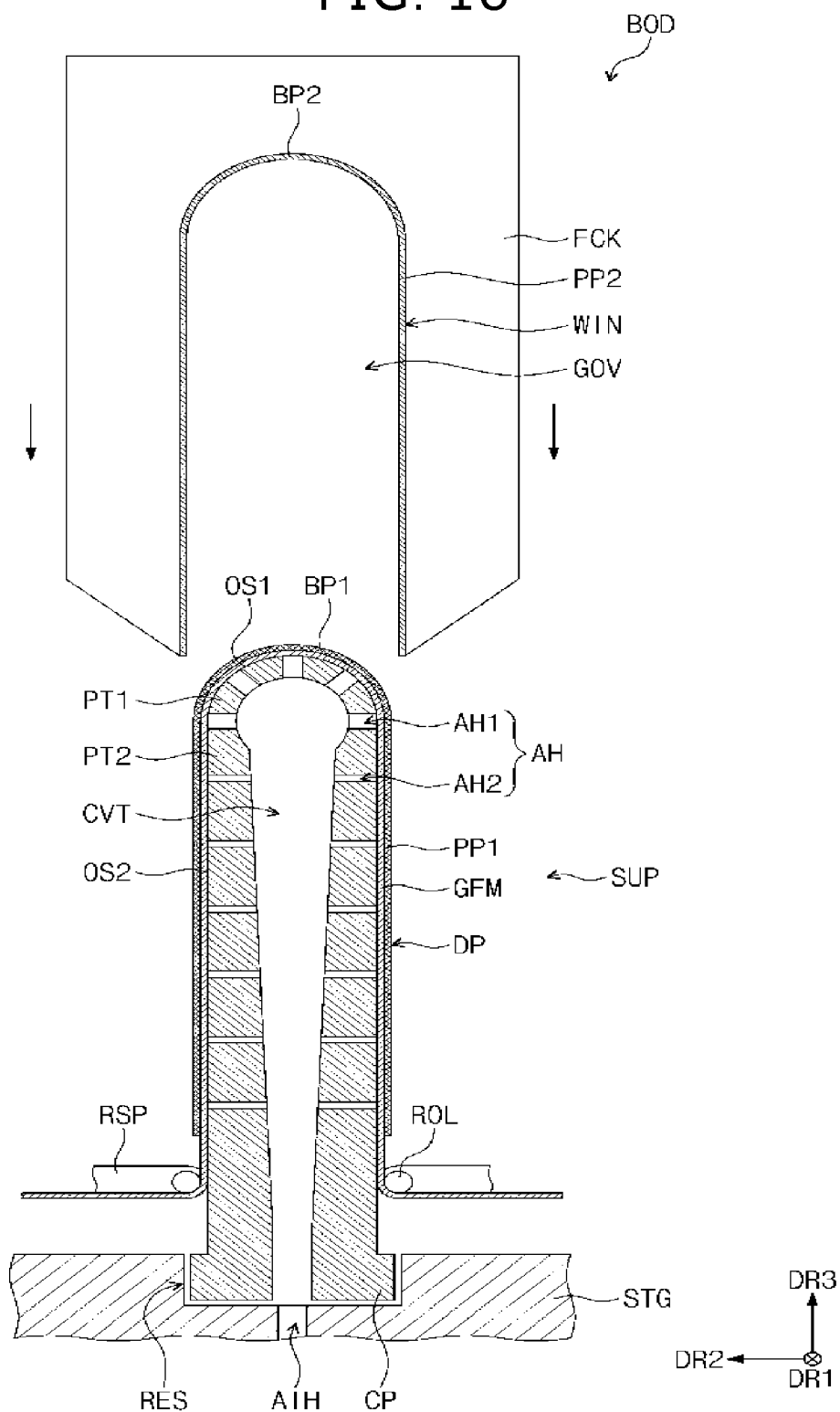

Referring to FIG. 18, the window fixing chuck FCK may be placed on the support SUP. The window fixing chuck FCK may be disposed to face the support SUP. Substantially, the stage STG may move onto a position where the window fixing chuck FCK may be disposed, and thus the window fixing chuck FCK may be disposed on the support SUP. The window fixing chuck FCK may be placed such that groove GOV may face or overlap the support SUP. The groove GOV may have a substantially concave shape at its inside distal end that may face or overlap the support SUP.

The window WIN may be disposed in the groove GOV. The window WIN disposed in the groove GOV may have a substantially bent shape. Although not shown, the window fixing chuck FCK may have vacuum adsorption holes at its inner surface on which the groove GOV may be defined, which vacuum adsorption holes may adsorb and fix the window WIN thereon.

The first part PT1 may face the groove GOV. The first outer surface OS1 having the curved surface may face the groove GOV. The window fixing chuck FCK may have a concavely curved surface at the inside distal end of the groove GOV, which distal end may face or overlap the first outer surface OS1.

The guide film GFM may be disposed on an outer surface of the support SUP, and the display panel DP may be disposed on the guide film GFM. The outer surface of the support SUP may be defined by the first outer surface OS1 and the second outer surfaces OS2. Therefore, the guide film GFM may place the display panel DP on the outer surface of the support SUP. Although not shown in FIG. 18, the adhesive ADH may be disposed on the display panel DP.

The guide film GFM may be disposed on the stage STG, and may extend along the rollers ROL to thereby have a position on the first outer surface OS1 and the second outer surfaces OS2. The rollers ROL may guide and place the display panel DP and the guide film GFM in positions adjacent to the second outer surfaces OS2.

The display panel DP may be disposed along the first outer surface OS1 having the curved surface and along the second outer surfaces OS2 each having the plane defined by the first and second directions DR1 and DR2, with the result that the display panel DP may have a substantially bent shape. The display panel DP may include a first bent part BP1 and first flat parts PP1. The first bent part BP1 may be disposed on the first outer surface OS1. The first flat parts PP1 may be disposed on the second outer surfaces OS2. The first bent part BP1 may be disposed on the first through holes AH1, and the first flat parts PP1 may be disposed on the second through holes AH2.

The first bent part BP1 may have a substantially bent shape, and the first flat parts PP1 may have their substantially flat shapes. When the display panel DP is unfolded, the first bent part BP1 may be disposed between the first flat parts PP1.

The window WIN may include a second bent part BP2 that may correspond to the first bent part BP1 and second flat parts PP2 that may correspond to the first flat parts PP1. When the window WIN is unfolded, the second bent part BP2 may be disposed between the second flat parts PP2. The bonding apparatus BOD may attach the first bent part BP1 to the second bent part BP2, and may also attach the first flat parts PP1 to the second flat parts PP2. This operation will be further discussed in detail below.

The connection part CP may be disposed in the recession RES of the stage STG. The stage STG may have an air injection hole AIH extending in the third direction DR3 at its portion where the recession RES may be defined. When viewed in the third direction DR3, the air injection hole AIH may overlap the cavity CVT.

Referring to FIGS. 18 and 19, the support SUP may be disposed in the groove GOV, and thus the display panel DP may be placed in the groove GOV. To allow the support SUP to have a position in the groove GOV, the window fixing chuck FCK may move in the third direction DR3 to become close to the support SUP.

The disclosure, however, is not limited thereto, and the support SUP may move in the third direction DR3 to have a position in the groove GOV. Substantially, the stage STG may move in the third direction DR3 to place the support SUP in the groove GOV. Alternatively, the window fixing chuck FCK and the support SUP may simultaneously move in the third direction DR3 to become close to each other.

When the window fixing chuck FCK moves in the third direction DR3 to insert the support SUP into the groove GOV, the display panel DP and the window WIN may be disposed spaced apart from each other in order not to allow the adhesive ADH to attach the display panel DP to the window WIN. Therefore, in the groove GOV, the display panel DP may be placed spaced apart at a certain or predetermined interval from the window WIN. The interval between the display panel DP and the window WIN may be in a range from about 0.2 mm to about 0.3 mm.

Referring to FIG. 20, air AIR may be introduced into the cavity CVT, and the air AIR may be provided through the cavity CVT to the first through holes AH1 and the second through holes AH2. The cavity CVT, the first through holes AH1, and the second through holes AH2 may substantially define an air path along which the air AIR may flow.

For example, although the air AIR may be provided to the cavity CVT and the first and second through holes AH1 and AH2, various fluids or gasses including air may be provided to the cavity CVT and the first and second through holes AH1 and AH2.

An increase in size or a reduction in length of an air flow space may promote an increase in air speed through the space. As discussed above, the first lengths LT1 of the first through holes AH1 may be less than the second lengths LT2 of the second through holes AH2, and the sizes of the first through holes AH1 may be greater than the sizes of the second through holes AH2. In other words, the area of the first through holes AH1 may be greater than the area of the second through holes AH2 as illustrated for example in FIG. 12. Therefore, the air AIR may pass more rapidly through the first through holes AH1 than through the second through holes AH2, and may then be externally discharged from the first part PT1.

The display panel DP may be provided with the air AIR that may pass through the first through holes AH1. A pressure (or pneumatic pressure) of the air AIR introduced into the first through holes AH1 may force the first bent part BP1 of the display panel DP to move away from the first part PT1. Therefore, the window WIN may receive the first bent part BP1 at its second bent part BP2 adjacent to the first bent part BP1.

The air AIR introduced into the first through holes AH1 may compel the first bent part BP1 to move toward the second bent part BP2, and thus the first bent part BP1 may be attached to the second bent part BP2. Substantially, the adhesive ADH disposed on the display panel DP may attach the first bent part BP1 to the second bent part BP2.

Referring to FIG. 21, after passing through the first through holes AH1, the air AIR may pass through the second through holes AH2 and may then be externally discharged from the second part PT2. As discussed above, the second lengths LT2 of the second through holes AH2 may increase in the downward direction. The air AIR may pass ahead through the second through hole AH2 whose length may be relatively small. Therefore, the air AIR may sequentially pass through the second through holes AH2 from the upper portion to the lower portion of the second part PT2.

The display panel DP may be provided with the air AIR that may pass through the second through holes AH2. A pressure (or pneumatic pressure) of the air AIR introduced into the second through holes AH2 may force the first flat parts PP1 of the display panel DP to move away from the second part PT2. The second part PT2 may outwardly push the first flat parts PP1 sequentially from the upper portion to the lower portion of the second part PT2. The window WIN may receive the first flat parts PP1 at its second flat parts PP2 adjacent to the first flat parts PP1.

The air AIR introduced into the second through holes AH2 may compel the first flat parts PP1 to move toward the second flat parts PP2, and thus the first flat parts PP1 may be attached to the second flat parts PP2. Substantially, the adhesive ADH disposed on the display panel DP may attach the first flat parts PP1 to the second flat parts PP2.

The first flat parts PP1 may be sequentially attached to the second flat parts PP2 from portions of the first flat parts PP1 that may be adjacent to the first bent part BP1 to distal ends of the first flat parts PP1. Therefore, the air AIR introduced into the first through holes AH1 and the second through holes AH2 may compel the display panel DP to move toward the window WIN, and accordingly the display panel DP may be attached to the window WIN.

Although not shown, after the display panel DP is attached to the window WIN, the guide film GFM may be separated from the display panel DP.

In a case that the bonding apparatus BOD of the disclosure is not used when the display panel DP in a bent state may be inserted into and attached to the window WIN in a bent state, the first flat parts PP1 may be first attached to the second flat parts PP2 of the window WIN. In this case, there may occur bonding failure in which the first bent part BP1 may not be attached to the second bent part BP2.

In contrast, according to an embodiment, the bonding apparatus BOD may be configured such that the display panel DP may be attached to the window WIN in a sequence from the first bent part BP1 to the first flat parts PP1, which may result in an easy bonding of the display panel DP to the window WIN. Accordingly, no bonding failure may be present between the display panel DP and the window WIN.

In the bonding process described above, based on the structure of the support SUP and the window fixing chuck FCK, the display panel DP and the window WIN may be changed from their flat states into their approximately 180° bent states to bond the first and second bent parts BP1 and BP2 each having a substantially semicircular shape. With regard to the flat display panel DP by way of example, the phrase "the 180° bent state" may indicate a structure in which one of the first flat parts PP1 pivotally moves 180° about the first bent part BP1 and may face or overlap other first flat part PP1 while extending in the third direction DR3.

However, an embodiment are not limited thereto, and the bonding apparatus BOD of the disclosure may be used to bond the display panel DP and the window WIN each have various curved surfaces. For example, the shape of the groove GOV defined on the window fixing chuck FCK and the shape of the support SUP may be changed such that the display panel DP and the window WIN may be bonded to each other while having their bending angles of equal to or greater than about 90° and less than about 180°. For example, the first and second bent parts BP1 and BP2 may be processed to have various substantially curved shapes.

Figure 22:
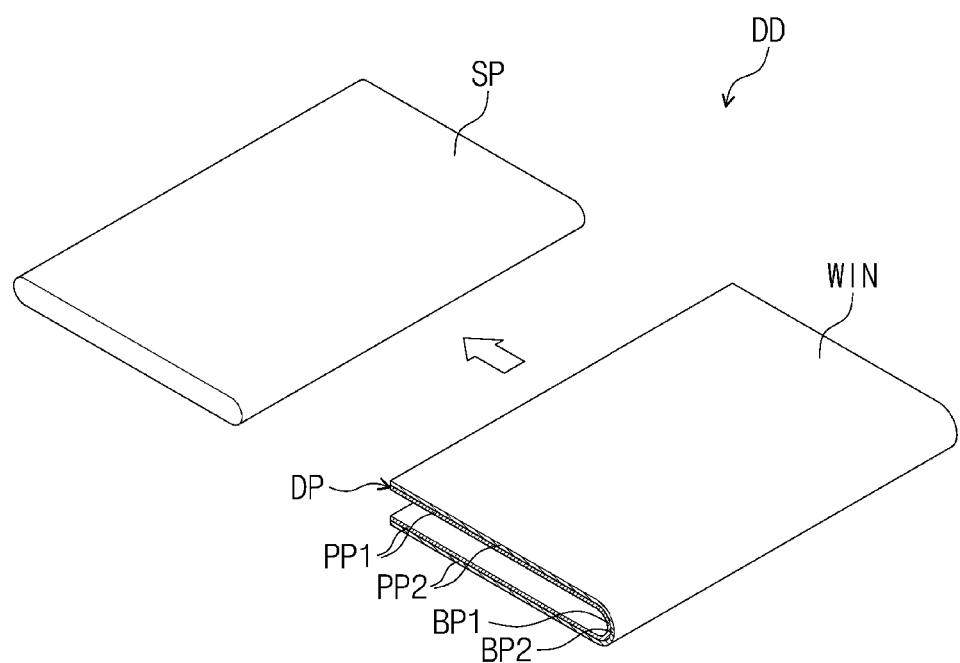
FIG. 22 illustrates a perspective view showing a support for connection with a display panel and a window.
Figure 23:
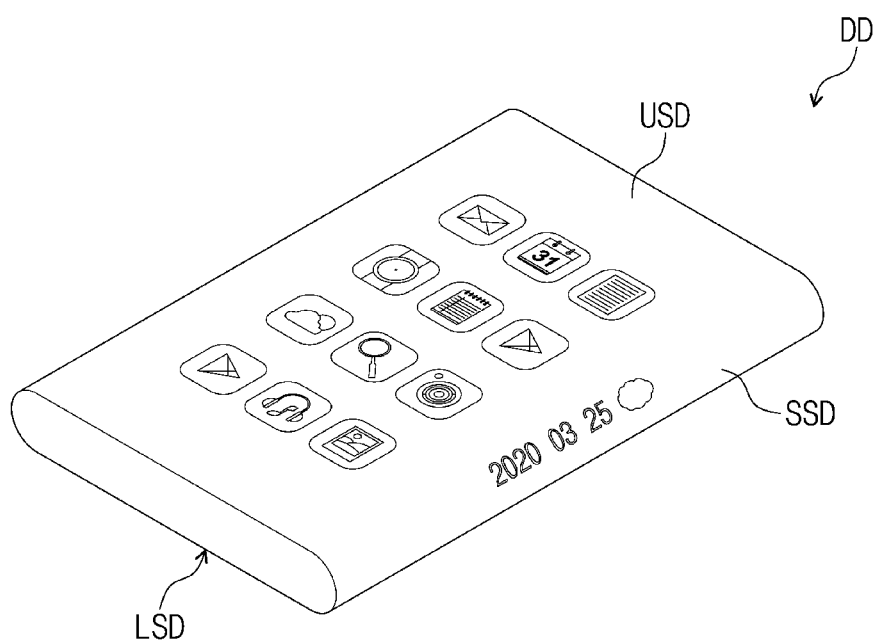
FIG. 23 illustrates a perspective view showing a display device fabricated by a display panel, a window, and a support that are bonded to each other.

FIG. 22 illustrates a perspective view showing the support for connection with the display panel and the window. FIG. 23 illustrates a perspective view showing a display device fabricated by the display panel, the window, and the support that may be bonded to each other.

Referring to FIG. 22, a supporter SP may be coupled to the display panel DP and the window WIN that have their bending structures and may be bonded to each other. The supporter SP may be disposed between the first flat parts PP1 of the display panel DP. The supporter SP may include a bracket that may support the display panel DP, a battery that may supply the display panel DP with power, and a system board that may control an operation of the display panel DP.

Referring to FIGS. 22 and 23, the first bent part BP1 of the display panel DP may define a side display section SSD of a display device DD. The first flat parts PP1 of the display panel DP may define a front display section USD of the display device DD and a rear display section LSD of the display device DD.

An image may be displayed on the front display section USD, the rear display section LSD, and the side display section SSD. For example, the front display section USD may display certain or predetermined icons, and the side display section SSD may display dates, weather, and the like within the spirit and the scope of the disclosure. This, however, is illustrated by way of example, and the front display section USD and the side display section SSD may display various images. Although not visible in perspective view, the rear display section LSD may also display various images.

The following will describe various examples of the support. For example, the following description will focus on supports whose configurations may be different from that of the support SUP discussed above, and the same component is illustrated using the same reference symbol.

Figure 24:
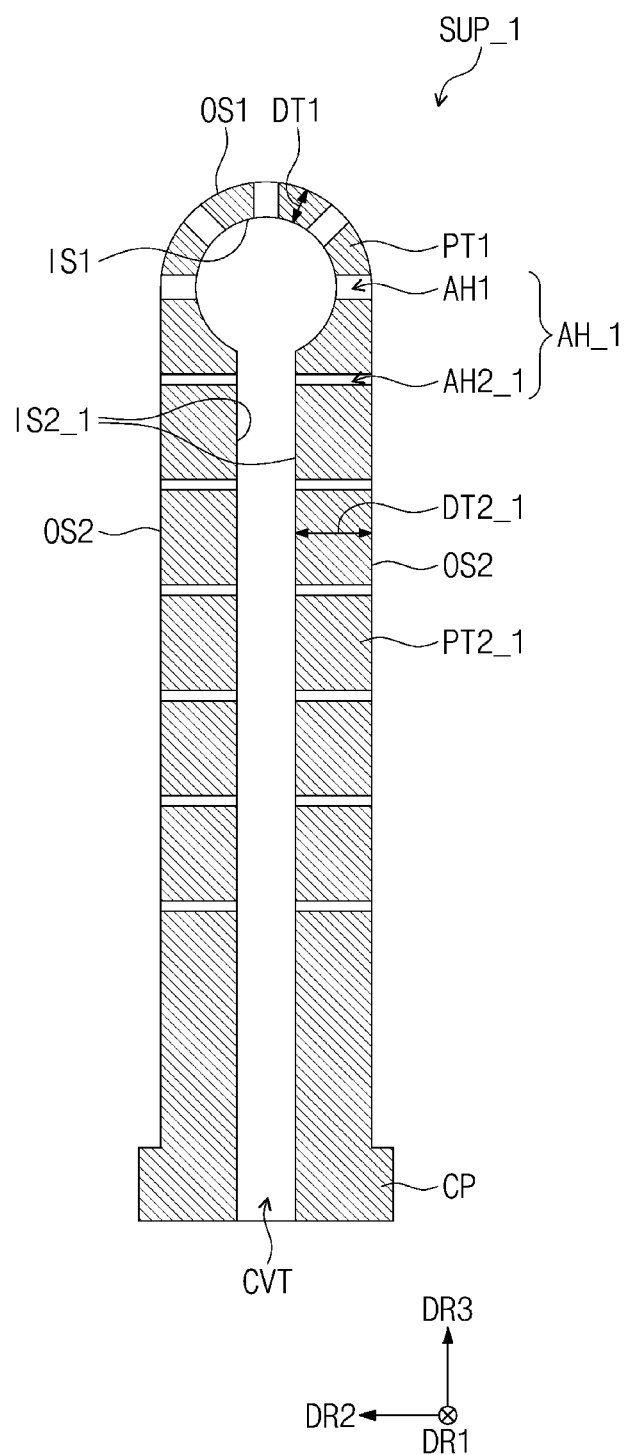
FIG. 24 illustrates a schematic cross-sectional view showing a configuration of a support according to an embodiment.

FIG. 24 illustrates a schematic cross-sectional view showing a configuration of a support according to an embodiment.

FIG. 24 shows by way of example a schematic cross-sectional view corresponding to that of FIG. 10.

Referring to FIG. 24, a support SUP_1 may include a first part PT1, a second part PT2_1, and a connection part CP. Through holes AH_1 may include first through holes AH1 defined in the first part PT1 and second through holes AH2_1 defined in the second part PT2_1. The first and second through holes AH1 and AH2_1 may extend from a cavity CVT. Substantially, the first part PT1 may have the same configuration as that of the first part PT1 shown in FIG. 10.

The second part PT2_1 may have a thickness that may be uniform from an upper portion of the second part PT2_1 to a lower portion of the second part PT2_1. Therefore, a second outer surface OS2 and a second inner surface IS2_1 may have therebetween a second distance DT2_1 that may be uniformly maintained or consistent from the upper portion of the second part PT2_1 to the lower portion of the second part PT2_1. In this case, the second through holes AH2_1 may have the same length.

The first through holes AH1 may have their lengths less than those of the second through holes AH2_1, and may have their sizes greater than those of the second through holes AH2_1. Thus, as discussed in FIGS. 20 and 21, the air AIR may pass more rapidly through the first through holes AH1 than through the second through holes AH2_1. As a result, the first bent part BP1 of the display panel DP may be first attached to the second bent part BP2 of the window WIN, and thereafter, the first flat parts PP1 of the display panel DP may be attached to the second flat parts PP2 of the window WIN.

Figure 25:
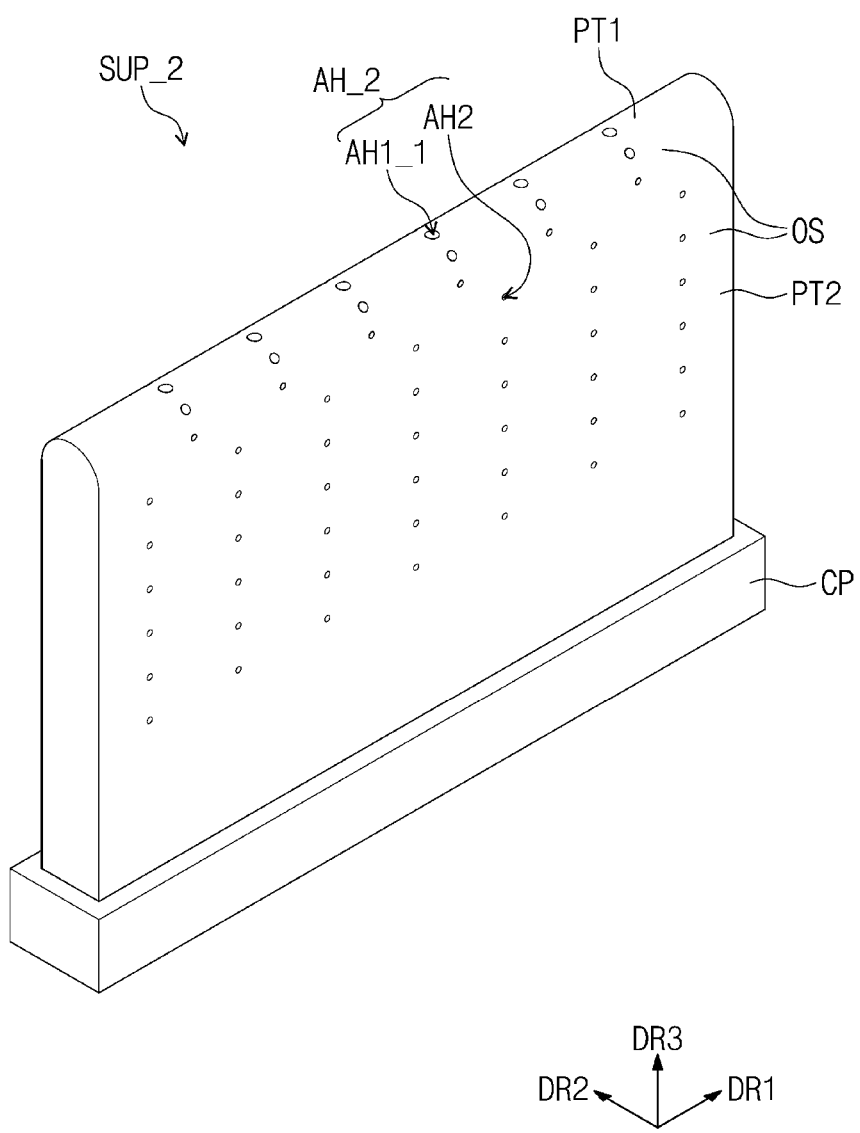
FIG. 25 illustrates a perspective view showing a configuration of a support according to an embodiment.
Figure 26:
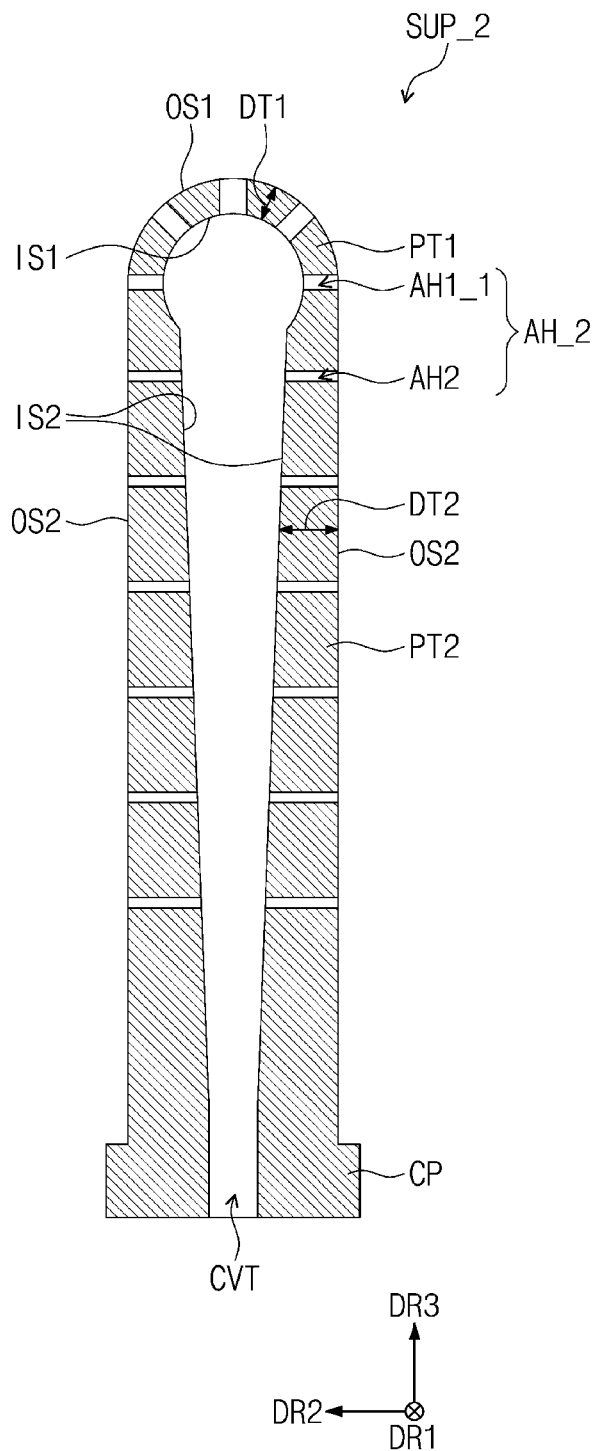
FIG. 26 illustrates a schematic cross-sectional view showing the configuration of the support depicted in FIG. 25.

FIG. 25 illustrates a perspective view showing a configuration of a support according to an embodiment. FIG. 26 illustrates a schematic cross-sectional view showing the configuration of the support depicted in FIG. 25.

FIG. 25 shows by way of example a perspective view corresponding to that of FIG. 5, and FIG. 26 shows by way of example a schematic cross-sectional view corresponding to that of FIG. 10.

Referring to FIGS. 25 and 26, a support SUP_2 may include a first part PT1, a second part PT2, and a connection part CP, and through holes AH_2 may include first through holes AH1_1 defined in the first part PT1 and second through holes AH2 defined in the second part PT2. The first and second through holes AH1_1 and AH2 may extend from a cavity CVT.

The first through holes AH1_1 may have their lengths less than those of the second through holes AH2, and may have their sizes greater than those of the second through holes AH2. The sizes of the first through holes AH1_1 may decrease as approaching the second part PT2 from a central portion of the first part PT1.

The air AIR may pass more rapidly through the first through holes AH1_1 than through the second through holes AH2. Therefore, as discussed in FIGS. 20 and 21, the first bent part BP1 may be first attached to the second bent part BP2, and thereafter, the first flat parts PP1 may be attached to the second flat parts PP2.

Figure 27:
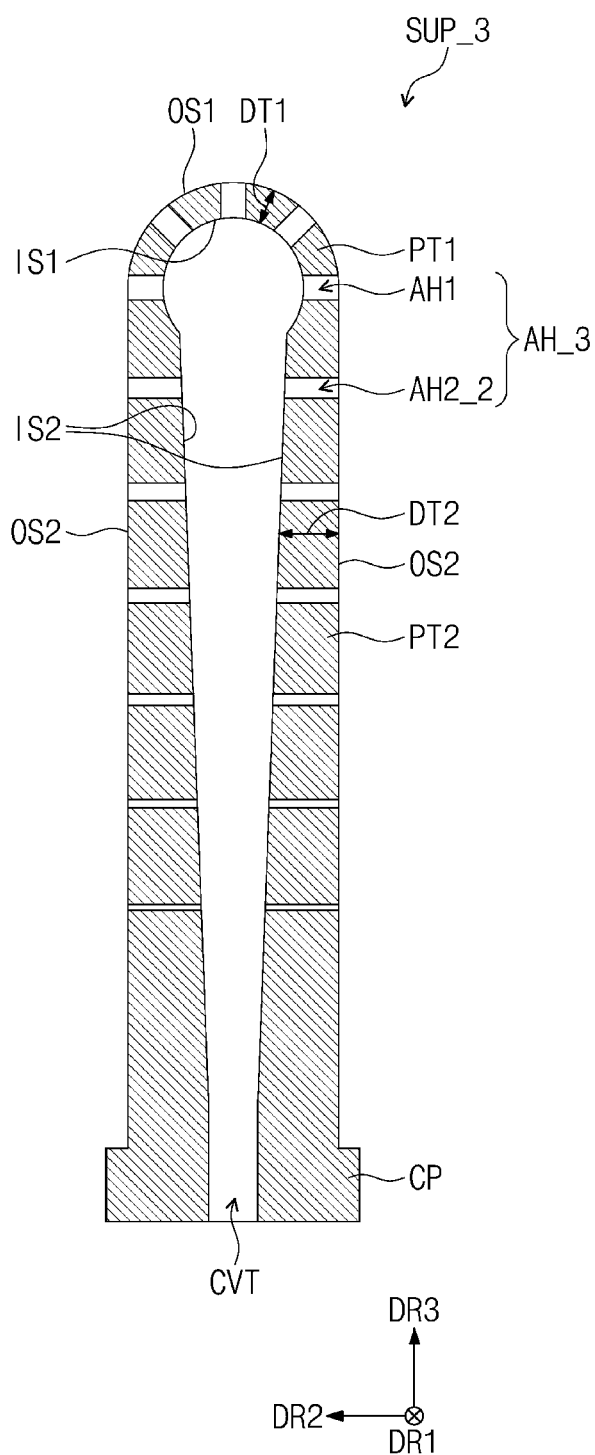
FIG. 27 illustrates a schematic cross-sectional view showing a configuration of a support according to an embodiment.

FIG. 27 illustrates a schematic cross-sectional view showing a configuration of a support according to an embodiment.

FIG. 27 shows by way of example a schematic cross-sectional view corresponding to that of FIG. 10.

Referring to FIG. 27, a support SUP_3 may include a first part PT1, a second part PT2, and a connection part CP. Through holes AH_3 may include first through holes AH1 defined in the first part PT1 and second through holes AH2_2 defined in the second part PT2.

The first through holes AH1 may have their lengths less than those of the second through holes AH2_2, and may have their sizes greater than those of the second through holes AH2_2. The sizes of the second through holes AH2_2 may decrease as approaching a lower portion of the second part PT2 from an upper portion of the second part PT2.

Therefore, the air AIR may pass more rapidly through the first through holes AH1 than through the second through holes AH2_2. As a result, the first bent part BP1 may be first attached to the second bent part BP2, and thereafter, the first flat parts PP1 may be attached to the second flat parts PP2.

Figure 28:
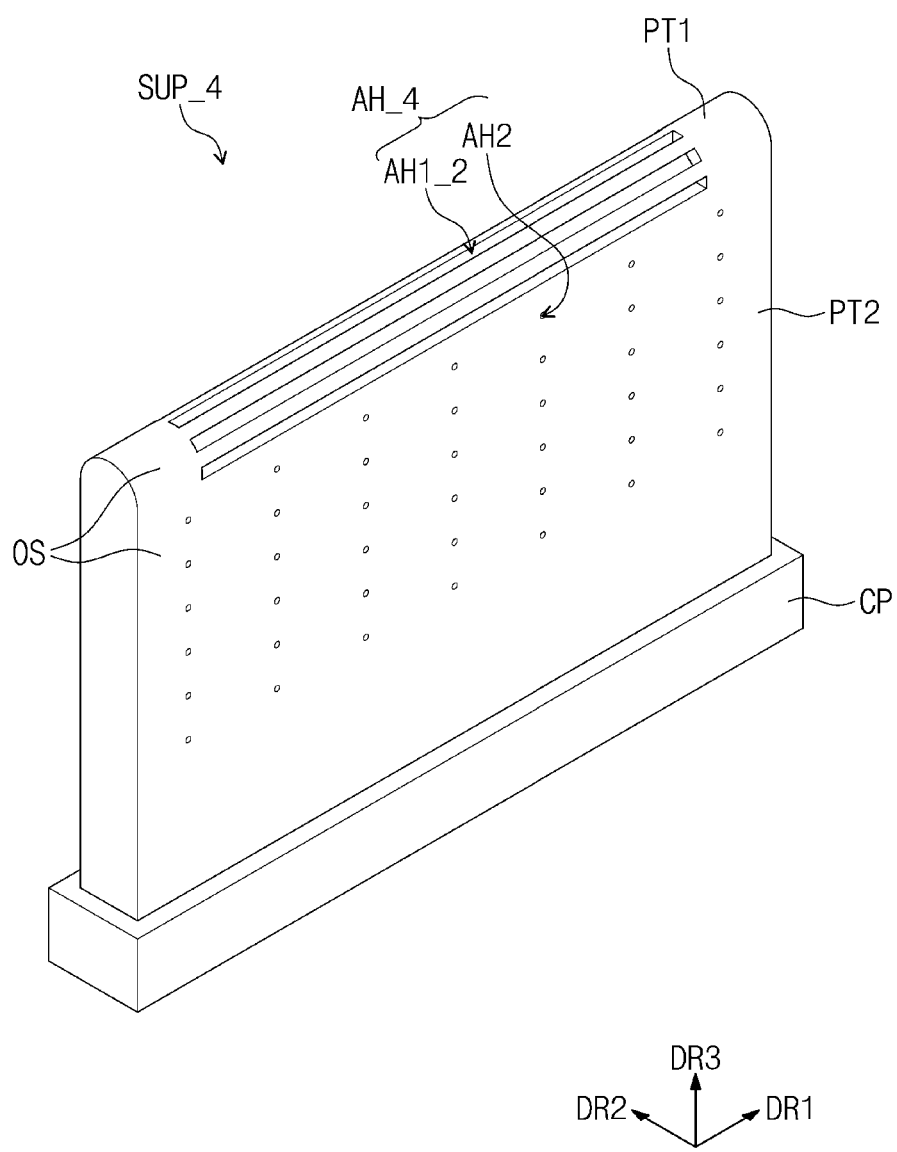
FIG. 28 illustrates a perspective view showing a configuration of a support according to an embodiment.

FIG. 28 illustrates a perspective view showing a configuration of a support according to an embodiment.

FIG. 28 shows by way of example a perspective view corresponding to that of FIG. 5.

Referring to FIG. 28, through holes AH_4 may include first through holes AH1_2 defined in a first part PT1 of a support SUP_4 and second through holes AH2 defined in a second part PT2 of the support SUP_4. The first through holes AH1_2 may extend in one or a direction. For example, the first through holes AH1_2 may extend in the first direction DR1 and may be arranged in the second direction DR2.

Although a schematic cross-sectional configuration is not shown, when viewed in the first direction DR1, the support SUP_4 may have a schematic cross-section whose structure may be the same as that of FIG. 10. Therefore, the first through holes AH1_2 may have their lengths less than those of the second through holes AH2, and may have their sizes greater than those of the second through holes AH2.

Figure 29:
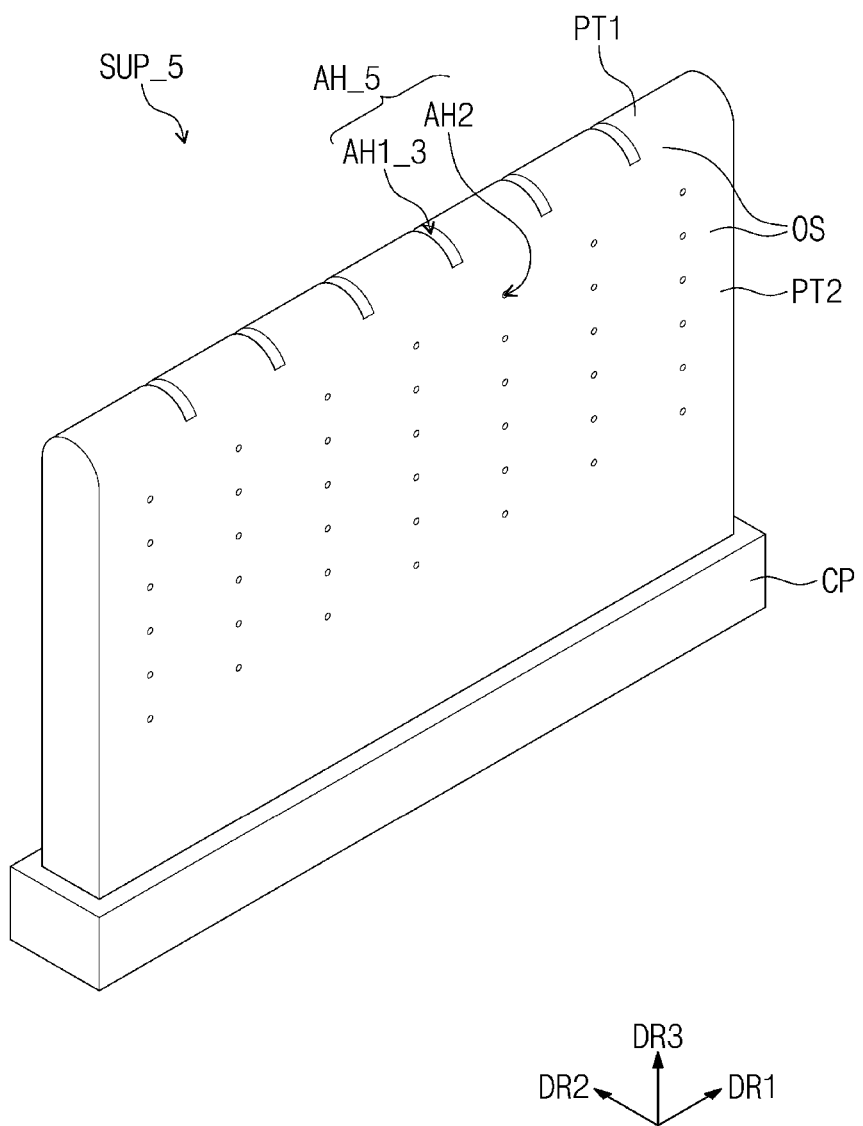
FIG. 29 illustrates a perspective view showing a configuration of a support according to an embodiment.

FIG. 29 illustrates a perspective view showing a configuration of a support according to an embodiment.

FIG. 29 shows by way of example a perspective view corresponding to that of FIG. 5.

Referring to FIG. 29, through holes AH_5 may include first through holes AH1_3 defined in a first part PT1 of a support SUP_5 and second through holes AH2 defined in a second part PT2 of the support SUP_5. The first through holes AH1_3 may extend in one or a direction. For example, the first through holes AH1_3 may extend in the second direction DR2 and may be arranged in the first direction DR1.

Figure 30:
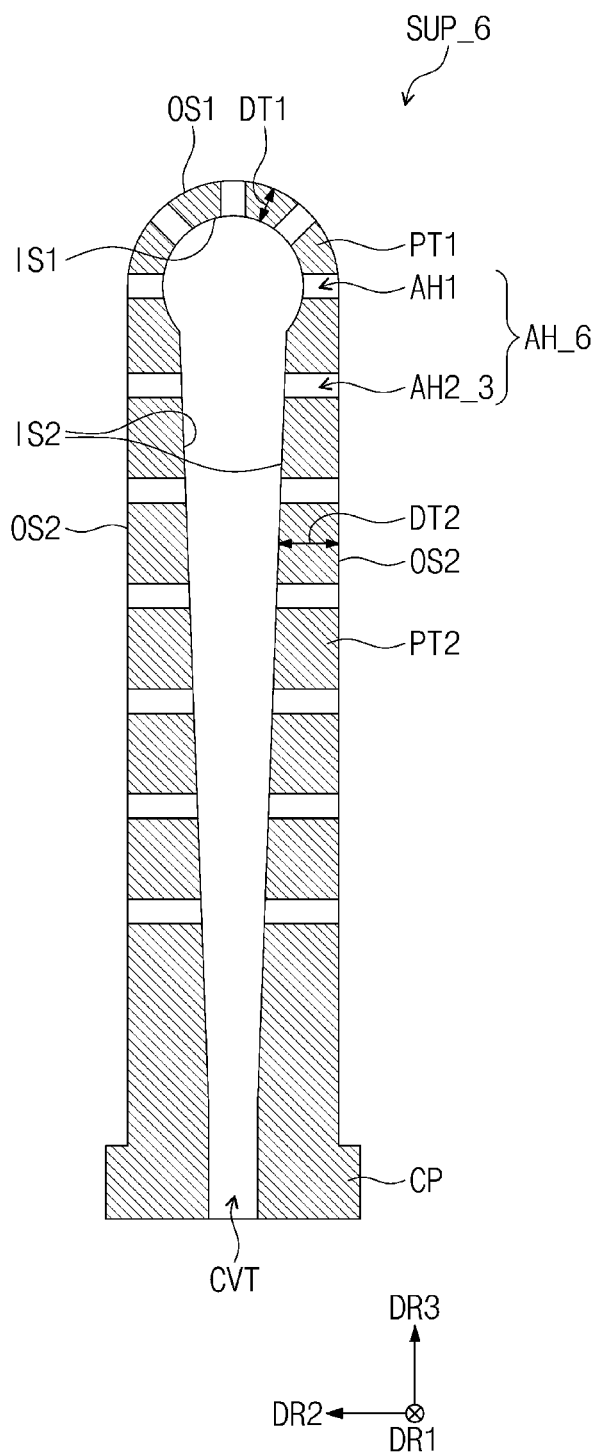
FIG. 30 illustrates a schematic cross-sectional view showing a configuration of a support according to an embodiment.

FIG. 30 illustrates a schematic cross-sectional view showing a configuration of a support according to an embodiment.

FIG. 30 shows by way of example a schematic cross-sectional view corresponding to that of FIG. 10.

Referring to FIG. 30, through holes AH_6 may include first through holes AH1 defined in a first part PT1 of a support SUP_6 and second through holes AH2_3 defined in a second part PT2 of the support SUP_6. The first through holes AH1 may have their lengths less than those of the second through holes AH2_3, and may have their sizes the same as those of the second through holes AH2_3.

As the lengths of the first through holes AH1 may be less than the lengths of the second through holes AH2_3, the air AIR may pass more rapidly through the first through holes AH1 than through the second through holes AH2_3. Therefore, the first bent part BP1 may be first attached to the second bent part BP2, and thereafter, the first flat parts PP1 may be attached to the second flat parts PP2.

Figure 31:
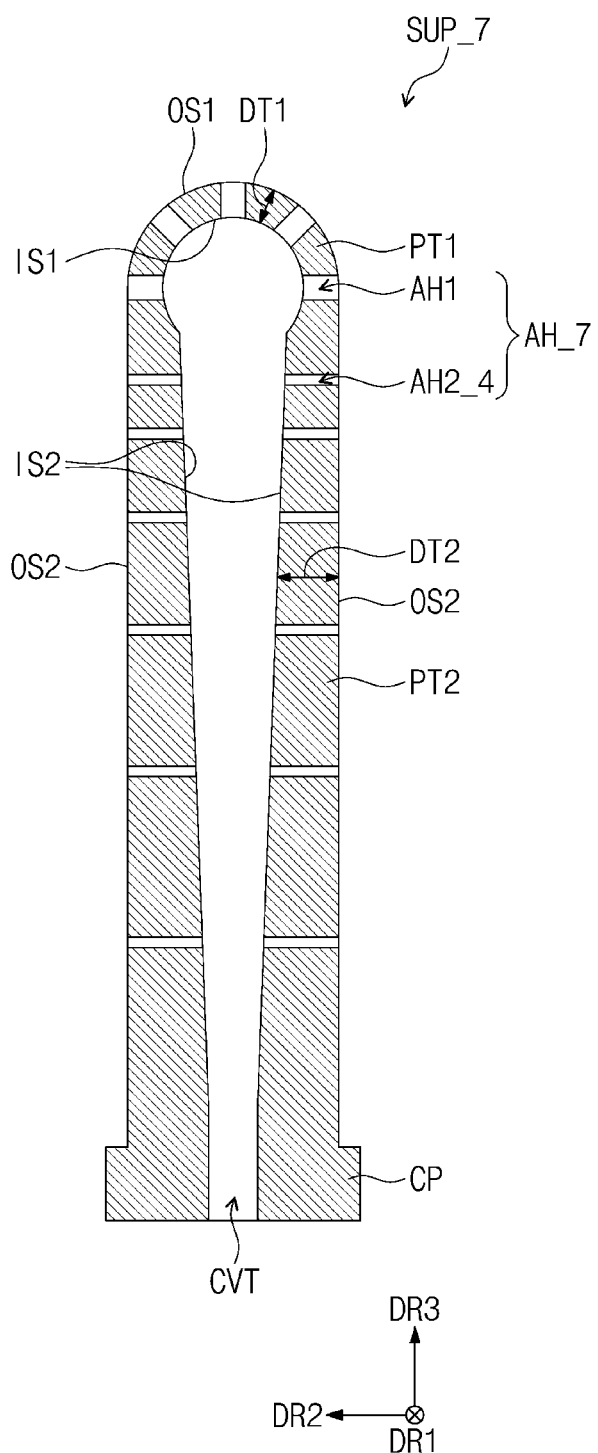
FIG. 31 illustrates a schematic cross-sectional view showing a configuration of a support according to an embodiment.

FIG. 31 illustrates a schematic cross-sectional view showing a configuration of a support according to an embodiment.

FIG. 31 shows by way of example a schematic cross-sectional view corresponding to that of FIG. 10.

Referring to FIG. 31, through holes AH_7 may include first through holes AH1 defined in a first part PT1 of a support SUP_7 and second through holes AH2_4 defined in a second part PT2 of the support SUP_7. When viewed in the third direction DR3, intervals between the second through holes AH2_4 may increase as approaching a lower portion of the second part PT2 from an upper portion of the second part PT2. The first through holes AH1 may have their lengths less than those of the second through holes AH2_4, and may have their sizes greater than those of the second through holes AH2_4.

Figure 32:
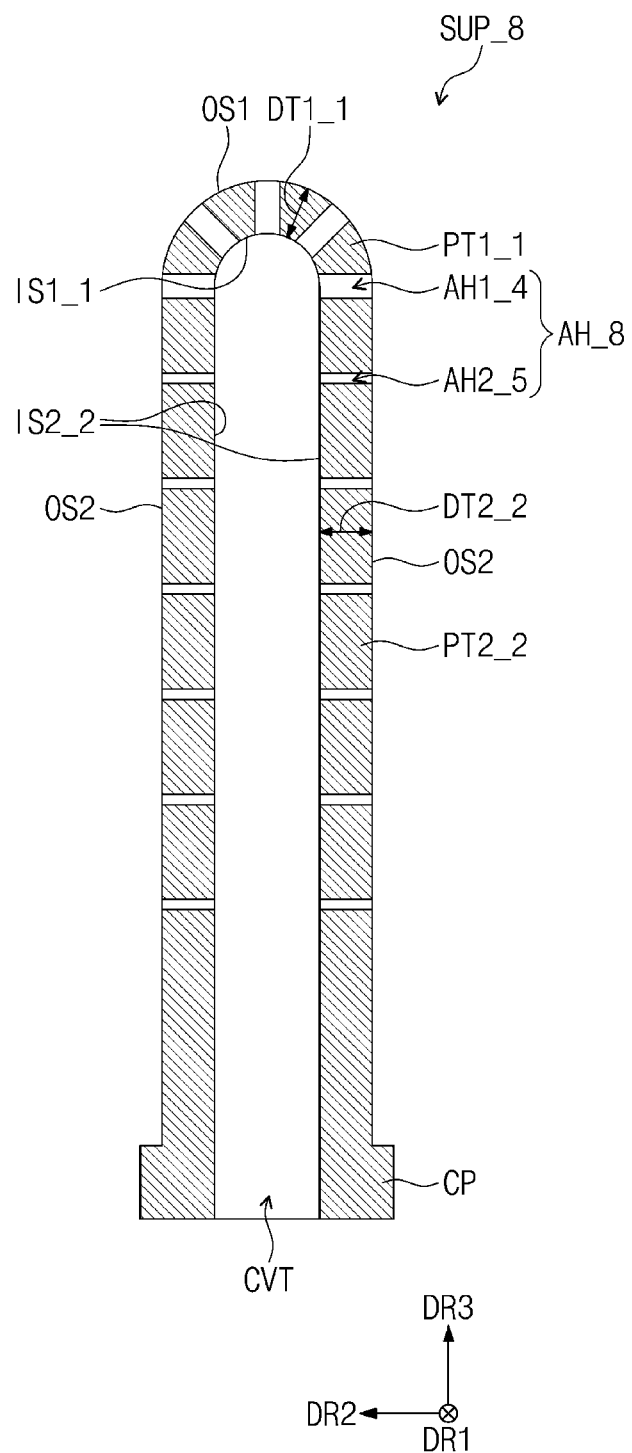
FIG. 32 illustrates a schematic cross-sectional view showing a configuration of a support according to an embodiment.

FIG. 32 illustrates a schematic cross-sectional view showing a configuration of a support according to an embodiment.

FIG. 32 shows by way of example a schematic cross-sectional view corresponding to that of FIG. 10.

Referring to FIG. 32, a support SUP_8 may include a first part PT1_1 and a second part PT2_2. The first part PT1_1 may have a convexly curved surface at an upper portion thereof, and the second part PT2_2 may extend in the downward direction from the first part PT1_1. The first and second parts PT1_1 and PT2_2 may have the same thickness. For example, a first distance DT1_1 of the first part PT1_1 may be the same as a second distance DT2_2 of the second part PT2_2. FIG. 32 includes first inner surfaces IS1_1 and second inner surfaces IS2_2.

Through holes AH_8 may include first through holes AH1_4 defined in the first part PT1_1 and second through holes AH2_5 defined in the second part PT2_2. The first through holes AH1_4 may have their lengths the same as those of the second through holes AH2_5. The first through holes AH1_4 may have their sizes greater than those of the second through holes AH2_5.

As the sizes of the first through holes AH1_4 may be greater than the sizes of the second through holes AH2_5, the air AIR may pass more rapidly through the first through holes AH1_4 than through the second through holes AH2_5. As a result, the first bent part BP1 may be first attached to the second bent part BP2, and thereafter, the first flat parts PP1 may be attached to the second flat parts PP2.

Figure 33:
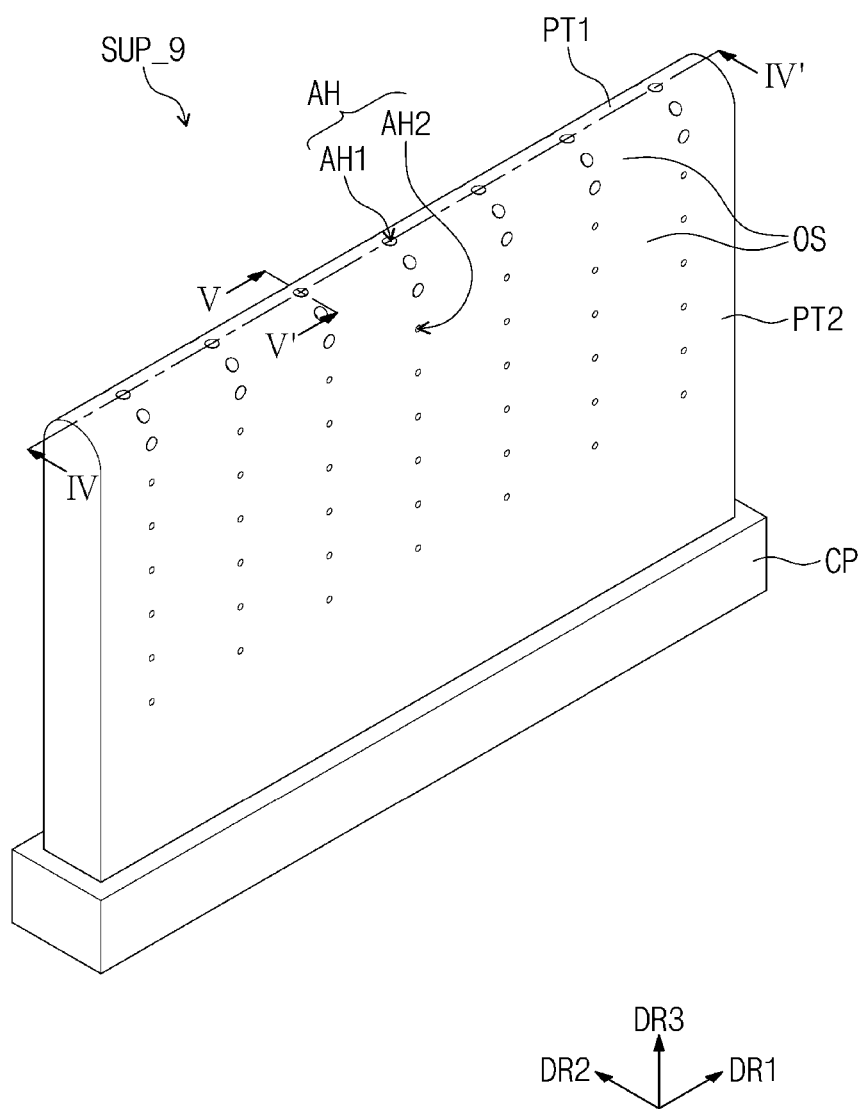
FIG. 33 illustrates a perspective view showing a configuration of a support according to an embodiment.
Figure 34:
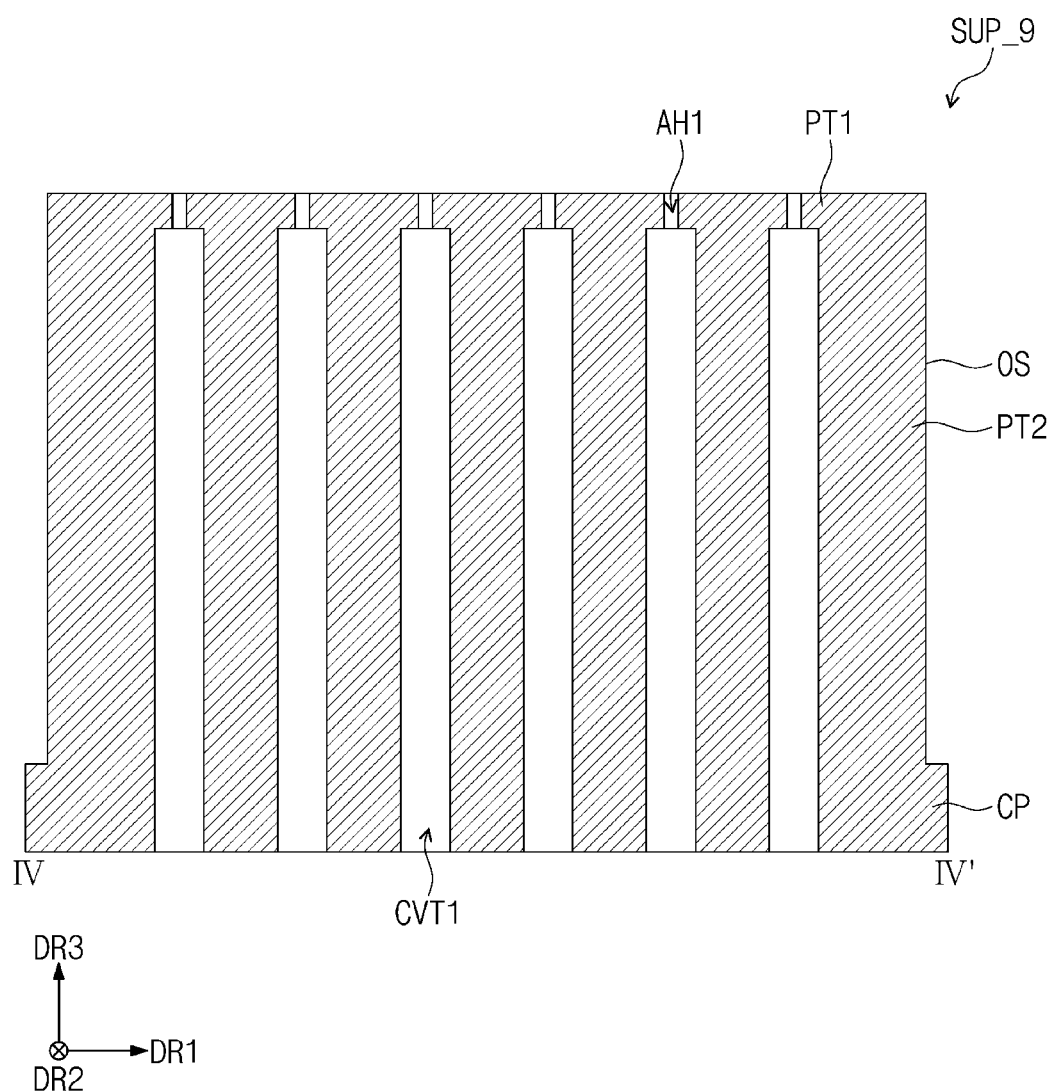
FIG. 34 illustrates a schematic cross-sectional view taken along line IV-IV' of FIG. 33.
Figure 35:
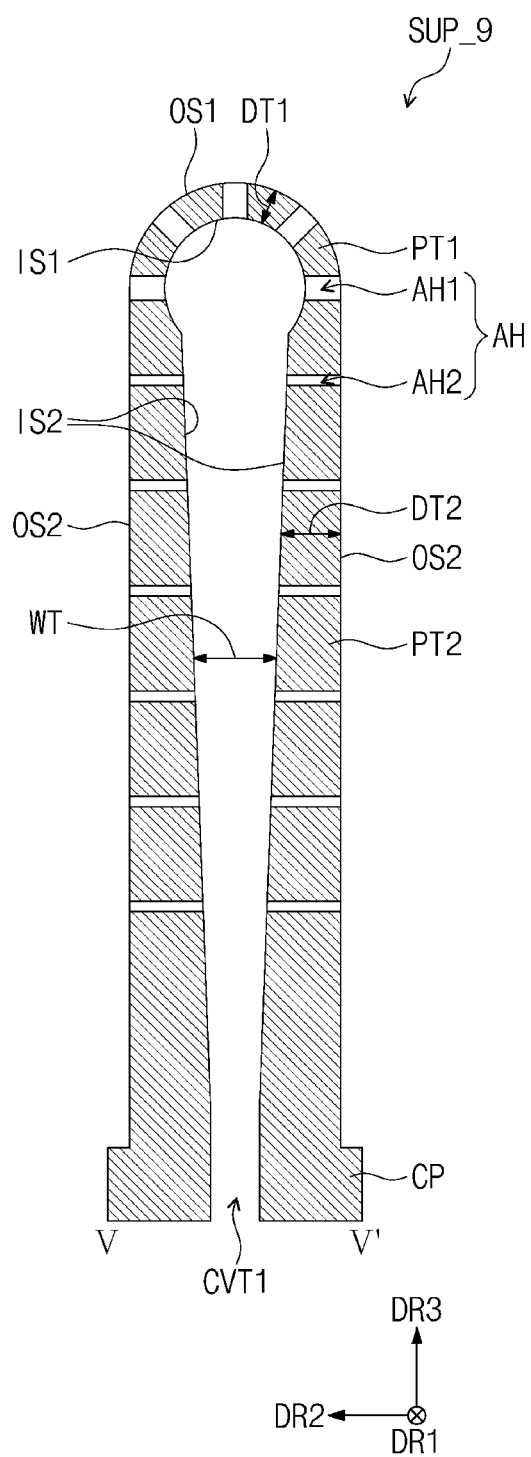
FIG. 35 illustrates a schematic cross-sectional view taken along line V-V' of FIG. 33.

FIG. 33 illustrates a perspective view showing a configuration of a support according to an embodiment. FIG. 34 illustrates a schematic cross-sectional view taken along line IV-IV' of FIG. 33. FIG. 35 illustrates a schematic cross-sectional view taken along line V-V' of FIG. 33.

FIG. 33 shows by way of example a perspective view corresponding to that of FIG. 5.

Referring to FIG. 33, through holes AH may include first through holes AH1 defined in a first part PT1 of a support SUP_9 and second through holes AH2 defined in a second part PT2 of the support SUP_9. Shapes of the first and second through holes AH1 and AH2 shown in FIG. 33 may be substantially the same as those of the first and second through holes AH1 and AH2 shown in FIG. 5.

Unlike the structure in which the first through holes AH1 and the second through holes AH2 may be disposed alternately with each other as shown in FIG. 5, the first through holes AH1 and the second through holes AH2 may be arranged in the same columns as shown in FIG. 33. The columns may extend in the third direction DR3.

Referring to FIG. 34, the support SUP_9 may have therein cavities CVT1 that may be open in the downward direction. The cavities CVT1 may extend in the third direction DR3 and may be arranged in the first direction DR1. The cavities CVT1 may be continuously defined from the first part PT1 to the second part PT2, and may be open on a bottom end of the second part PT2. The first through holes AH1 may be arranged in the first direction DR1 and may extend in the third direction DR3 from the cavities CVT1.

Referring to FIG. 35, the first through holes AH1 may be defined in the first part PT1, and the second through holes AH2 may be defined in the second part PT2. The arrangement structure of the first and second through holes AH1 and AH2 shown in FIG. 35 may be substantially the same as that illustrated in FIG. 10, and thus a repetitive description thereof will be omitted.

Figure 36:
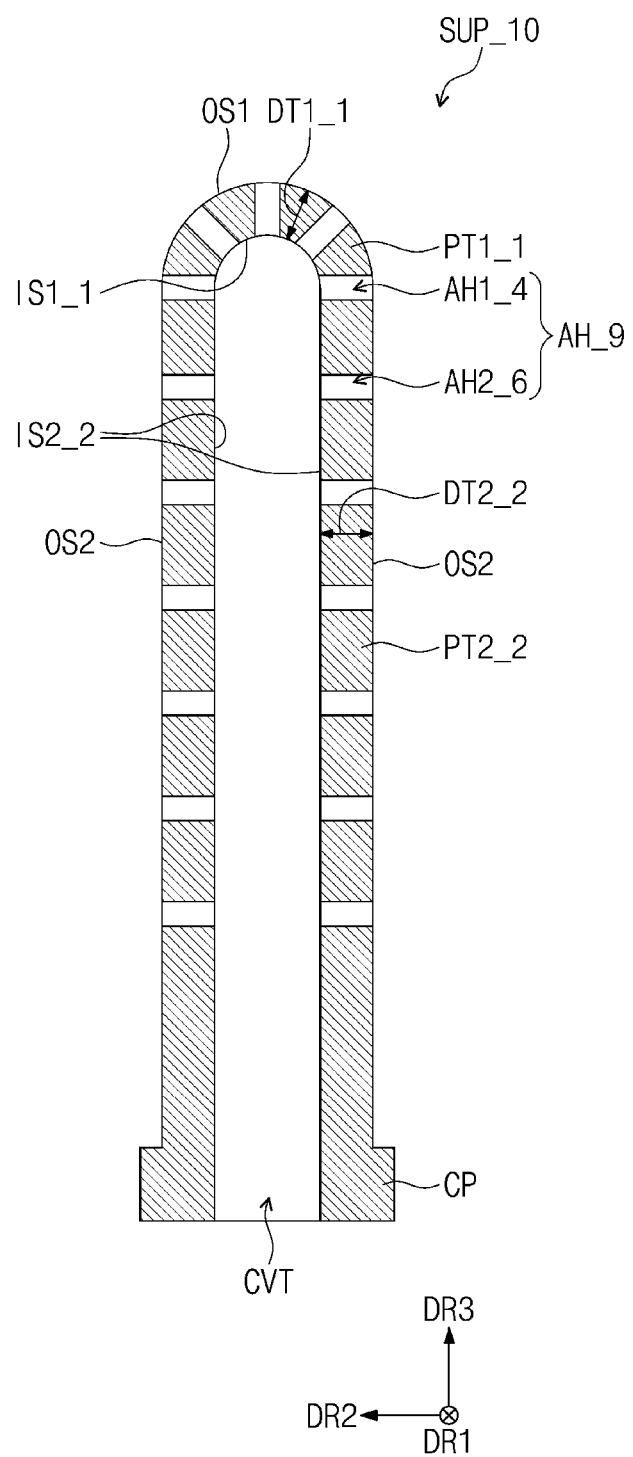
FIG. 36 illustrates a schematic cross-sectional view showing a configuration of a support according to an embodiment.

FIG. 36 illustrates a schematic cross-sectional view showing a configuration of a support according to an embodiment.

FIG. 36 shows by way of example a schematic cross-sectional view corresponding to that of FIG. 10.

Referring to FIG. 36, a support SUP 10 may include a first part PT1_1 and a second part PT2_2. The first and second parts PT1_1 and PT2_2 shown in FIG. 36 may have substantially the same configuration as that of the first and second parts PT1_1 and PT2_2 shown in FIG. 32. FIG. 36 includes first inner surfaces IS1_1 and second inner surfaces IS2_2.

Through holes AH_9 may include first through holes AH1_4 defined in the first part PT1_1 and second through holes AH2_6 defined in the second part PT2_2. The first through holes AH1_4 may have their lengths the same as those of the second through holes AH2_6. The first through holes AH1_4 may have their sizes the same as those of the second through holes AH2_6.

According to an embodiment, a first bent part of a display panel may be attached to a second bent part of a window, and thereafter, a first flat part of the display panel may be attached to a second flat part adjacent to the first flat part of the window. Accordingly, no bonding failure may be present between the first bent part and the second bent part.

Although the disclosure is described in conjunction with an embodiment thereof, it would be understood by those skilled in the art that the disclosure may be modified or changed in various ways without departing from spirit and scope of the disclosure defined by the appended claims. Further, the embodiments disclosed herein are not intended to limit the technical spirit of the disclosure and all technical spirit within the claims and their equivalents should be construed as being included in the disclosure.

What is claimed is:

1. A bonding apparatus, comprising:
a support including a cavity; and
a window fixing chuck facing the support, wherein the support includes:
- a first part including a first through hole extending from the cavity; and
- a second part extending in a downward direction from the first part and including a second through hole extending from the cavity,
- a first distance between a first inner surface of the first part and a first outer surface of the first part is less than a second distance between a second inner surface of the second part and a second outer surface of the second part, and
- the first inner surface of the first part and the second inner surface of the second part form the cavity.

2. The bonding apparatus of claim 1, wherein a length of the first through hole of the first part is less than a length of the second through hole of the second part.

3. The bonding apparatus of claim 1, wherein a size of the first through hole in an extending direction of the first through hole is greater than a size of the second through hole in an extending direction of the second through hole.

4. The bonding apparatus of claim 1, wherein the second distance of the second part increases as approaching a lower portion of the second part from an upper portion of the second part, the upper portion of the second part being adjacent to the first part.

5. The bonding apparatus of claim 4, wherein
- the first part includes a plurality of first through holes,
- the second part includes a plurality of second through holes, and
- lengths of the plurality of second through holes increase as approaching the lower portion of the second part from the upper portion of the second part.

6. The bonding apparatus of claim 5, wherein a number of the plurality of first through holes of the first part is less than a number of the plurality of second through holes of the second part.

7. The bonding apparatus of claim 5, wherein an interval between the plurality of first through holes of the first part is different from an interval between the plurality of second through holes of the second part.

8. The bonding apparatus of claim 1, wherein
- the support extends in a third direction intersecting a plane defined by a first direction and a second direction, the second direction intersecting the first direction,
- the first outer surface of the first part includes a curved surface that is convex in an upper direction viewed in the first direction, and
- the second outer surface of the second part includes a plane defined by the first and third directions.

9. The bonding apparatus of claim 8, wherein
- the first distance of the first part is measured in a normal direction to the first outer surface of the first part, and
- the second distance of the second part is measured in the second direction.

10. The bonding apparatus of claim 9, wherein
- the window fixing chuck includes a groove, the groove facing the support and extending in the first direction, and
- the window fixing chuck includes a concavely curved surface at an inside distal end of the groove facing the curved surface of the first outer surface of the first part.

11. The bonding apparatus of claim 8, wherein the second inner surface of the second part includes a surface inclined at a predetermined angle relative to the third direction.

12. The bonding apparatus of claim 1, wherein the second distance of the second part is consistent from an upper portion of the second part to a lower portion of the second part, the upper portion of the second part being adjacent to the first part.

13. The bonding apparatus of claim 1, wherein
- the first part includes a plurality of first through holes, and
- sizes of the plurality of first through holes in extending directions of the plurality of first through holes decrease approaching the second part from a central portion of the first part.

14. The bonding apparatus of claim 1, wherein
- the second part includes a plurality of second through holes, and
- sizes of the plurality of second through holes in extending directions of the plurality of second through holes decrease approaching a lower portion of the second part from an upper portion of the second part, the upper portion of the second part being adjacent to the first part.

15. The bonding apparatus of claim 1, wherein the first through hole extends in a direction.

16. The bonding apparatus of claim 1, wherein a size of the first through hole in an extending direction of the first through hole is the same as a size of the second through hole in an extending direction of the second through hole.

17. The bonding apparatus of claim 1, wherein
- the second part includes a plurality of second through holes, and
- intervals between the plurality of second through holes increase as approaching a lower portion of the second part from an upper portion of the second part, the upper portion of the second part being adjacent to the first part.

18. The bonding apparatus of claim 1, wherein
- the bonding apparatus includes a plurality of cavities, a plurality of first through holes, and a plurality of second through holes, and
- the plurality of first through holes and the plurality of second through holes extend from the plurality of cavities.

* * * * *